(12) United States Patent
Tsuboi

(10) Patent No.: US 10,998,392 B2
(45) Date of Patent: May 4, 2021

(54) DISPLAY APPARATUS AND ELECTRONIC DEVICE

(71) Applicant: CANON KABUSHIKI KAISHA, Tokyo (JP)

(72) Inventor: Hiromasa Tsuboi, Tama (JP)

(73) Assignee: Canon Kabushiki Kaisha, Tokyo (JP)

( * ) Notice: Subject to any disclaimer, the term of this patent is extended or adjusted under 35 U.S.C. 154(b) by 13 days.

(21) Appl. No.: 16/662,804

(22) Filed: Oct. 24, 2019

(65) Prior Publication Data

US 2020/0135826 A1 Apr. 30, 2020

(30) Foreign Application Priority Data

Oct. 30, 2018 (JP) .............................. JP2018-204344

(51) Int. Cl.
*H01L 27/32* (2006.01)
*H01L 27/12* (2006.01)

(52) U.S. Cl.
CPC ...... *H01L 27/3262* (2013.01); *H01L 27/1214* (2013.01)

(58) Field of Classification Search
CPC .......................... H01L 27/3262; H01L 27/1214
See application file for complete search history.

(56) References Cited

U.S. PATENT DOCUMENTS

| 6,445,005 | B1 * | 9/2002 | Yamazaki | ............. H01L 27/322 257/72 |
| 6,894,312 | B2 | 5/2005 | Yamazaki et al. | |
| 7,119,777 | B2 * | 10/2006 | Chen | ................... H01L 27/1214 345/92 |
| 7,518,146 | B2 | 4/2009 | Yamazaki et al. | |
| 7,723,721 | B2 | 5/2010 | Udagawa et al. | |
| 7,952,103 | B2 | 5/2011 | Yamazaki et al. | |
| 8,154,015 | B2 | 4/2012 | Udagawa et al. | |
| 8,183,571 | B2 | 5/2012 | Yamazaki et al. | |
| 8,324,618 | B2 | 12/2012 | Udagawa et al. | |
| 8,450,745 | B2 | 5/2013 | Yamazaki et al. | |
| 8,648,338 | B2 | 2/2014 | Udagawa et al. | |
| 8,735,900 | B2 | 5/2014 | Yamazaki et al. | |

(Continued)

FOREIGN PATENT DOCUMENTS

| JP | 2001-217072 A | 8/2001 |
| JP | 2003-208110 A | 7/2003 |

(Continued)

*Primary Examiner* — Mark W Tornow
(74) *Attorney, Agent, or Firm* — Venable LLP

(57) ABSTRACT

A display apparatus including pixels is provided. Each pixels comprises a light-emitting element, a first transistor having a drain region connected to an anode of the light-emitting element, and a second transistor having a drain region connected to a gate electrode of the first transistor. The drain region of the first transistor includes a first region and a second region arranged between the first region and a channel region and having a higher resistivity than the first region. The drain region of the second transistor includes a third region and a fourth region arranged between the third region and a channel region and having a higher resistivity than the third region. A length of the second region in a direction in which a current flows is longer than that of the fourth region in a direction in which a current flows.

20 Claims, 13 Drawing Sheets

(56) References Cited

U.S. PATENT DOCUMENTS

| | | |
|---|---|---|
| 9,054,199 B2 | 6/2015 | Udagawa et al. |
| 9,059,049 B2 | 6/2015 | Yamazaki et al. |
| 9,431,470 B2 | 8/2016 | Yamazaki et al. |
| 9,577,016 B2 | 2/2017 | Udagawa et al. |
| 9,735,218 B2 | 8/2017 | Yamazaki et al. |
| 9,905,624 B2 | 2/2018 | Udagawa et al. |
| 2002/0190257 A1 | 12/2002 | Yamazaki et al. |
| 2003/0089905 A1 | 5/2003 | Udagawa et al. |
| 2005/0162092 A1 | 7/2005 | Yamazaki et al. |
| 2006/0214229 A1* | 9/2006 | Toyoda ............ H01L 29/78624 257/347 |
| 2007/0037069 A1* | 2/2007 | Ohnuma ............ H01L 27/1214 430/5 |
| 2008/0029793 A1* | 2/2008 | Watanabe ......... H01L 27/14689 257/291 |
| 2008/0278464 A1* | 11/2008 | Yamamoto ........... G09G 3/3233 345/204 |
| 2009/0267076 A1 | 10/2009 | Yamazaki et al. |
| 2010/0224868 A1 | 9/2010 | Udagawa et al. |
| 2011/0227088 A1 | 9/2011 | Yamazaki et al. |
| 2012/0181540 A1 | 7/2012 | Udagawa et al. |
| 2012/0286283 A1 | 11/2012 | Yamazaki et al. |
| 2013/0087775 A1 | 4/2013 | Udagawa et al. |
| 2013/0313558 A1 | 11/2013 | Yamazaki et al. |
| 2014/0151707 A1 | 6/2014 | Udagawa et al. |
| 2014/0252361 A1 | 9/2014 | Yamazaki et al. |
| 2015/0270322 A1 | 9/2015 | Udagawa et al. |
| 2015/0357389 A1 | 12/2015 | Yamazaki et al. |
| 2016/0365400 A1 | 12/2016 | Yamazaki et al. |
| 2017/0162642 A1 | 6/2017 | Udagawa et al. |
| 2018/0190745 A1 | 7/2018 | Udagawa et al. |
| 2019/0221627 A1 | 7/2019 | Udagawa et al. |
| 2019/0221628 A1 | 7/2019 | Udagawa et al. |
| 2019/0355311 A1 | 11/2019 | Ota et al. |

FOREIGN PATENT DOCUMENTS

| | | |
|---|---|---|
| JP | 2008-281671 A | 11/2008 |
| JP | 2010-145579 A | 7/2010 |

* cited by examiner

DISPLAY APPARATUS AND ELECTRONIC DEVICE

BACKGROUND OF THE INVENTION

Field of the Invention

The present invention relates to a display apparatus and an electronic device.

Description of the Related Art

There is known a display apparatus having an array of pixels including light-emitting elements such as organic EL (electroluminescence) elements that emit light with luminance corresponding to a current flowing in the elements. Japanese Patent Laid-Open Nos. 2010-145579 and 2008-281671 each disclose a pixel including a drive transistor for supplying a current corresponding to a luminance signal to a light-emitting element and a switching transistor that is provided on the gate end side of the drive transistor and introduces the luminance signal to the gate end of the drive transistor.

SUMMARY OF THE INVENTION

Japanese Patent Laid-Open No. 2008-281671 discloses that in order to suppress luminance signal variation caused by a leakage current in a switching transistor, the LDD length of the switching transistor is set to be longer than that of a drive transistor to make the leakage current smaller than that in the drive transistor. However, in a drive transistor that supplies a current to a light-emitting element, when a high electric field is applied to the drain region, a leakage current between the source region and the drain region or between the drain region and the well region can greatly increase. When a leakage current flows from the drive transistor to the light-emitting element, a bright point may be generated on a display image, resulting in a deterioration in image quality.

Some embodiments of the present invention provide techniques advantageous in improving the image quality of a display apparatus.

According to some embodiments, a display apparatus including a plurality of pixels arranged in an array on a substrate, each of the plurality of pixels comprising a light-emitting element, a first transistor having a drain region connected to an anode of the light-emitting element, and a second transistor having a drain region connected to a gate electrode of the first transistor, wherein the drain region of the first transistor includes a first region and a second region arranged between the first region and a channel region of the first transistor and having a higher resistivity than the first region, the drain region of the second transistor which is connected to the gate electrode of the first transistor includes a third region and a fourth region arranged between the third region and a channel region of the second transistor and having a higher resistivity than the third region, and in an orthogonal projection with respect to the substrate, a length of the second region in a direction in which a current flows is longer than a length of the fourth region in a direction in which a current flows, is provided.

According to some other embodiments, a display apparatus including a plurality of pixels arranged in an array on a substrate, each of the plurality of pixels comprising a light-emitting element, a first transistor having a drain region connected to an anode of the light-emitting element, and a second transistor having a drain region connected to a gate electrode of the first transistor, wherein the drain region of the first transistor includes a first region and a second region arranged between the first region and a channel region of the first transistor, the drain region of the second transistor which is connected to the gate electrode of the first transistor includes a third region and a fourth region arranged between the third region and a channel region of the second transistor, the second region has the same conductivity type as the conductivity type of the first region and a lower impurity concentration than the first region, the fourth region has the same conductivity type as the conductivity type of the third region and a lower impurity concentration than the third region, and in an orthogonal projection with respect to the substrate, a length of the second region in a direction in which a current flows is longer than a length of the fourth region in a direction in which a current flows, is provided.

According to still other embodiments, a display apparatus including a plurality of pixels arranged in an array on a substrate, each of the plurality of pixels comprising a light-emitting element, a first transistor having a drain region connected to an anode of the light-emitting element, and a second transistor having a drain region connected to a gate electrode of the first transistor, wherein the drain region of the first transistor includes a first region and a second region arranged between the first region and a channel region of the first transistor, the drain region of the second transistor which is connected to the gate electrode of the first transistor includes a third region and a fourth region arranged between the third region and a channel region of the second transistor, the first region and the third region each are formed from a compound of a semiconductor and a metal, the second region and the fourth region are formed from semiconductor materials, and in an orthogonal projection with respect to the substrate, a length of the second region in a direction in which a current flows is longer than a length of the fourth region in a direction in which a current flows, is provided.

Further features of the present invention will become apparent from the following description of exemplary embodiments (with reference to the attached drawings).

DESCRIPTION OF THE EMBODIMENTS

Figure 1:
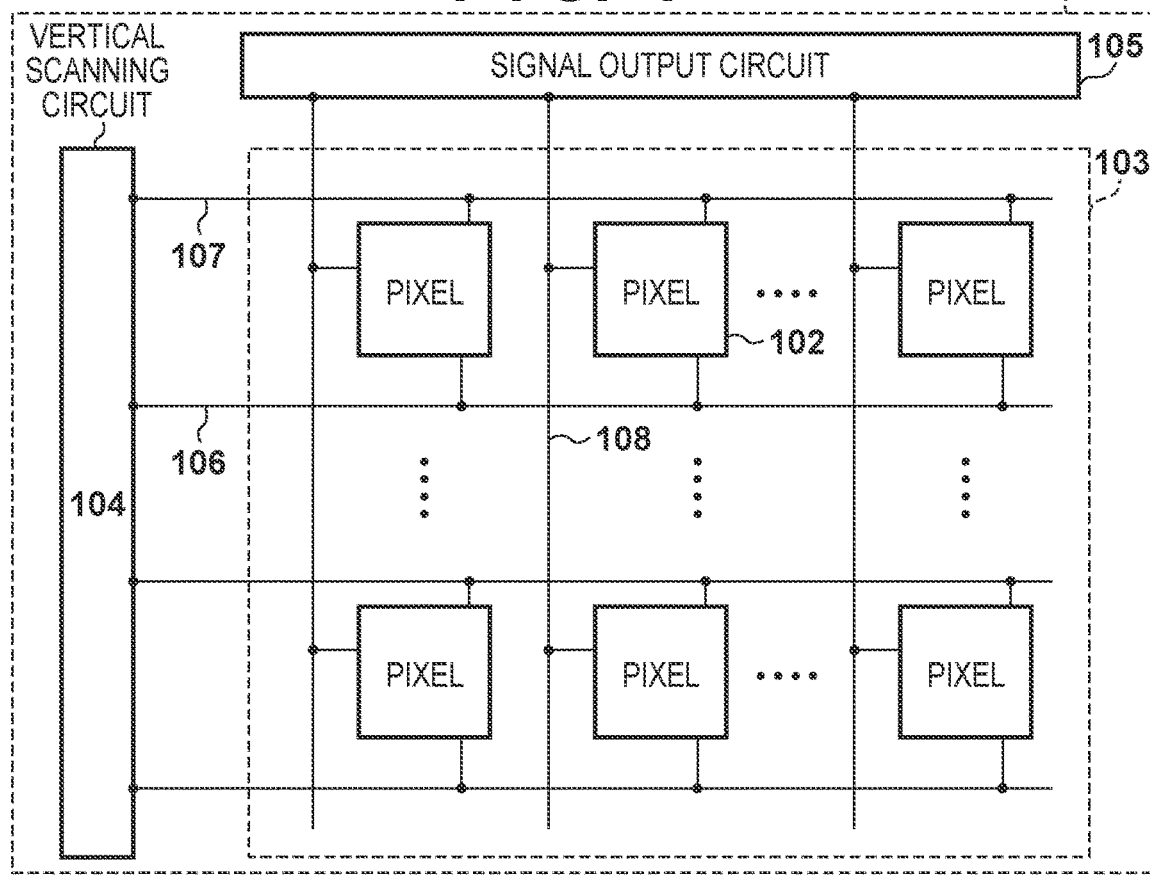
FIG. 1 is a block diagram showing an example of the arrangement of a display apparatus according to an embodiment of the present invention.

Specific embodiments of a recording apparatus according to the present invention will be described with reference to the accompanying drawings. Note that in the following description and drawings, common reference numerals denote common components throughout a plurality of drawings. Accordingly, the common components will be described by cross-referring to a plurality of drawings, and a description of components denoted by common reference numerals will appropriately be omitted.

Figure 2:
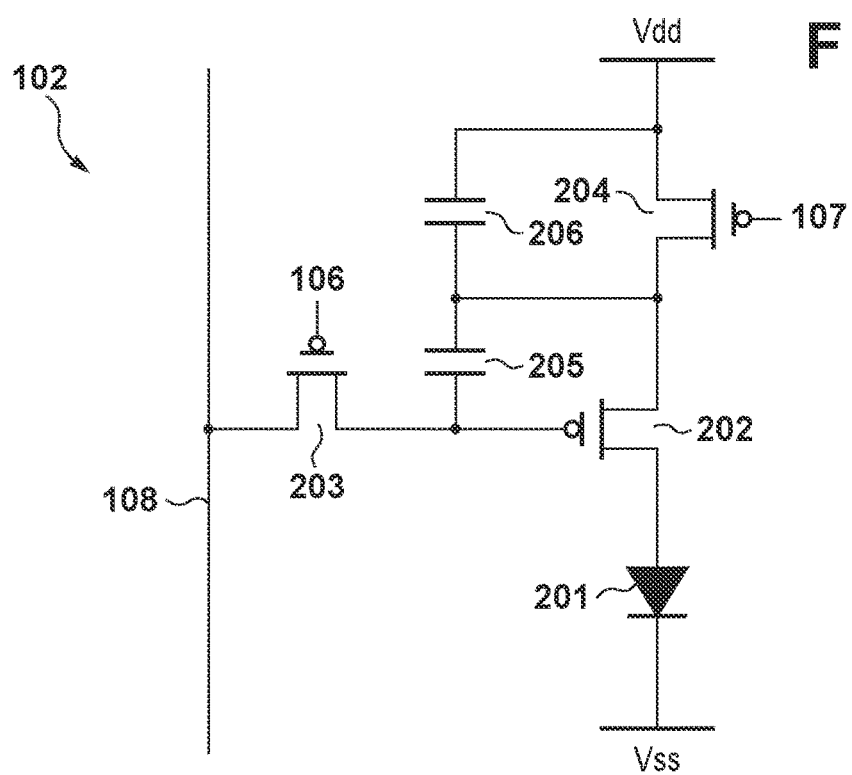
FIG. 2 is a circuit diagram showing an example of the arrangement of a pixel of the display apparatus in FIG. 1.

The arrangement of a display apparatus according to an embodiment of the present invention will be described with reference to FIGS. 1 to 4. FIG. 1 is a block diagram showing an example of the arrangement of a display apparatus 101 according to the first embodiment of the present invention. FIG. 2 is a circuit diagram showing a pixel 102 arranged in the display apparatus 101.

The following will describe a case in which a drive transistor 202 is connected to the anode of a light-emitting element 201 arranged in each pixel 102 of the display apparatus 101, and all the transistors arranged in the pixel 102 are p-type transistors. However, the arrangement of the pixel 102 of the display apparatus 101 is not limited to this. For example, each transistor may have an opposite polarity or conductivity type. Alternatively, for example, the drive transistor may be a p-type transistor, and the remaining transistors may be n-type transistors. Potentials to be supplied and connections may be changed as appropriate in accordance with the conductivity types or polarities of the light-emitting elements and the transistors included in the pixels 102 of the display apparatus 101.

In this embodiment, as shown in FIG. 1, the display device 101 includes a pixel array unit 103 and a drive unit arranged on a periphery of the pixel array unit 103. The pixel array unit 103 includes a plurality of pixels 102 arranged in an array. Each pixel 102 includes the light-emitting element 201, as shown in FIG. 2. The light-emitting element 201 includes an anode and a cathode, and has an organic layer including a light-emitting layer between the anode and the cathode. The organic layer may have one or a plurality of layers of a hole injection layer, a hole transport layer, an electron injection layer, and an electron transport layer, in addition to the light-emitting layer.

The drive unit is a circuit for driving the pixels 102 arranged in the pixel array unit 103. The driving unit includes a vertical scanning circuit 104 and a signal output circuit 105. In order to supply signals from the driving unit to the pixels 102, a scanning line 106 and a scanning line 107 extending along the row direction (the transverse direction in FIG. 1) are in the pixel array unit 103 for each pixel row of the pixels 102 arranged in an array. A signal line 108 extending along the column direction (the longitudinal direction in FIG. 1) is arranged in the pixel array unit 103 for each pixel column of the pixels 102 arranged in the array.

Each scanning line 106 and each scanning line 107 are connected to output terminals of a corresponding one of the pixel rows of the vertical scanning circuit 104. Each signal line 108 is connected to an output terminal of a corresponding one of the pixel columns of the signal output circuit 105.

The vertical scanning circuit 104 supplies write control signals to the scanning lines 106 when writing luminance signals to the respective pixels 102 of the pixel array unit 103. The vertical scanning circuit 104 also supplies, to the scanning lines 107, light emission control signals for driving the pixels 102 and causing them to emit light.

The signal output circuit 105 selects any one of a luminance signal having a voltage corresponding to luminance information when causing the light-emitting element 201 of each pixel 102 to emit light and a reference voltage signal having a reference voltage, as appropriate, and outputs the selected signal to the signal line 108. A luminance signal represents the luminance at each pixel 102 of the image displayed on the display apparatus 101 and can be called an image signal.

The circuit arrangement of each pixel 102 according to this embodiment will be described next with reference to FIG. 2. Each of the plurality of pixels 102 arranged in the pixel array unit 103 includes a current path including the light-emitting element 201 and the drive transistor 202 (first transistor) and a write transistor 203 (second transistor). The pixel 102 also includes a light emission control transistor 204 (fourth transistor) arranged in the current path including the light-emitting element 201 and the drive transistor 202. The pixel 102 includes a capacitive element 205 and a capacitive element 206. The total numbers of transistors and capacitive elements and the combination of the conductivity types of the transistors are merely examples, and are not limited to those in this arrangement.

In the following description, the expression "a transistor is connected between an element A and an element B" indicates that one of the main terminals of the transistor is connected to the element A, and the other main terminal of the transistor is connected to the element B. That is, the expression "a transistor is connected between an element A and an element B" does not include a case in which the control terminal of the transistor is connected to the element A, one of the main terminals is not connected to the element A, and the other main terminal is not connected to the element B. In this case, a main terminal of the transistor indicates a diffusion region functioning as the source region or drain region of the transistor. In addition, the control terminal of the transistor indicates the gate electrode of the transistor.

In the arrangement shown in FIG. 2, one end of the current path including the light-emitting element 201, the drive transistor 202, and light emission control transistor 204 is connected to a power supply potential Vss, and the other end is connected to a power supply potential Vdd. More specifically, the cathode of light-emitting element 201 is connected to the power supply potential Vss, and one (the source region in the arrangement in FIG. 2) of the main terminals of the light emission control transistor 204 is connected to the power supply potential Vdd. However, this is not exhaustive and another element may be arranged between the power supply potential Vss and the light-emitting element 201 or between the power supply potential Vdd and the light emission control transistor 204. Alternatively, another element may be arranged between the light-emitting element 201 and the drive transistor 202 or between the drive transistor 202 and the light emission control transistor 204. In addition, in the arrangement shown in FIG. 2, although the drive transistor 202 is arranged between the light-emitting element 201 and the light emission control transistor 204, the light emission control transistor 204 may be arranged between the light-emitting element 201 and the drive transistor 202.

One (the drain region in the arrangement in FIG. 2) of the main terminals of the drive transistor 202 is connected to the anode of the light-emitting element 201. The control terminal (gate electrode) of the drive transistor 202 is connected to one (the drain region in the arrangement in FIG. 2) of the main terminals of the write transistor 203. The drive transistor 202 drives the light-emitting element 201 by supplying a current corresponding to a luminance signal to the light-emitting element 201.

The light emission control transistor 204 is arranged between the drive transistor 202 and the power supply potential Vdd for supplying a drive current to the drive transistor 202. More specifically, as described above, one (the source region in the arrangement in FIG. 2) of the main terminals of the light emission control transistor 204 is connected to the power supply potential Vdd. The other main terminal (the drain region in the arrangement in FIG. 2) of the light emission control transistor 204 is connected to the other main terminal (the source region in the arrangement in FIG. 2) of the drive transistor 202. The control terminal of the light emission control transistor 204 is connected to the scanning line 107. In the arrangement shown in FIG. 2, the power supply potential Vdd is higher than the power supply potential Vss.

The write transistor 203 is arranged between the signal line 108 and the control terminal of the drive transistor 202. More specifically, one (the drain region in the arrangement in FIG. 2) of the main terminals of the write transistor 203 is connected to the control terminal of the drive transistor 202, as described above, and the other main terminal (the source region in the arrangement in FIG. 2) of the write transistor 203 is connected to the signal line 108. The control terminal of the write transistor 203 is connected to the scanning line 106.

The capacitive element 205 is connected between the control terminal and the other main terminal (the source region in the arrangement in FIG. 2) of the drive transistor 202. The capacitive element 206 is connected between the power supply potential Vdd and the main terminal of the drive transistor 202 to which the light emission control transistor 204 is connected.

The drive transistor 202 causes the light-emitting element 201 to emit light by supplying a current from the power supply potential Vdd to the light-emitting element 201 via the light emission control transistor 204. More specifically, the drive transistor 202 supplies, to the light-emitting element 201, a current corresponding to the signal voltage of a luminance signal held in the capacitive element 205. This causes the light-emitting element 201 to emit light by current driving.

The write transistor 203 is rendered conductive in response to a write control signal applied from the vertical scanning circuit 104 to the control terminal via the scanning line 106. This causes the write transistor 203 to sample the signal voltage or reference voltage of a luminance signal corresponding to luminance information supplied from the signal output circuit 105 via the signal line 108 and write the sampled voltage in the pixel 102. This written signal voltage or reference voltage is applied to the control terminal of the drive transistor 202 and held in the capacitive element 205.

That is, the write transistor 203 is arranged to transmit a luminance signal to cause the light-emitting element 201 to emit light with luminance corresponding to luminance information, and transmits the luminance signal to the control terminal of the drive transistor 202.

The light emission control transistor 204 is rendered conductive in response to a light emission control signal applied from the vertical scanning circuit 104 to the control terminal via the scanning line 107, thereby permitting the supply of a current from the power supply potential Vdd to the drive transistor 202. Accordingly, as described above, the drive transistor 202 can drive the light-emitting element 201. That is, the light emission control transistor 204 functions as a switch element that controls emission or non-emission of the light-emitting element 201 by controlling the conduction state of the current path.

Performing a switching operation of the light emission control transistor 204 in this manner can provide a period during which the light-emitting element 201 is set in a non-emission state (non-emission period) and control the ratio between the non-emission period of the light-emitting element 201 and the emission period during which the light-emitting element 201 emits light (so-called duty control). This duty control can reduce afterimage blurring accompanying light emission from the light-emitting element 201 of each pixel 102 over a 1-frame period and further improve the image quality of a moving image in particular. This embodiment exemplifies the case in which the light emission control transistor 204 is arranged in the pixel 102. However, the display apparatus 101 operates even in a case in which the light emission control transistor 204 is not arranged in the pixel 102.

As the light-emitting element 201, an organic EL (Organic Electroluminescent) element can be used. At the time of light emission from the light-emitting element 201, the amount of current flowing through the drive transistor 202 changes in accordance with the signal voltage applied from the signal line 108 to the control terminal of the drive transistor 202 via the write transistor 203. This charges the capacitance constituted by the anode and the cathode of light-emitting element 201 to a predetermined potential. A current corresponding to this potential difference flows in the light-emitting element 201. This causes the light-emitting element 201 to emit light with a predetermined luminance.

Figure 3:
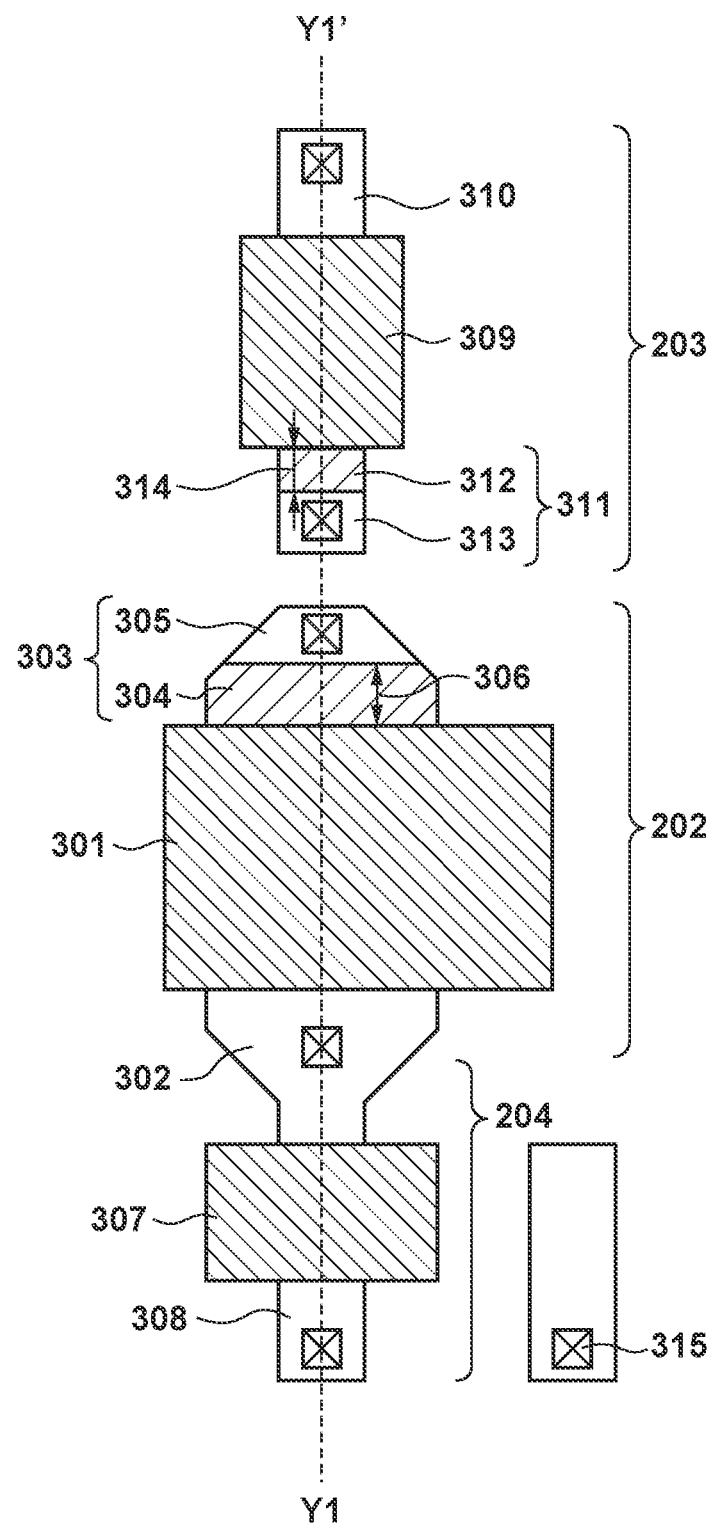
FIG. 3 is a plan view showing an example of the arrangement of a pixel of the display apparatus in FIG. 1.
Figure 4:
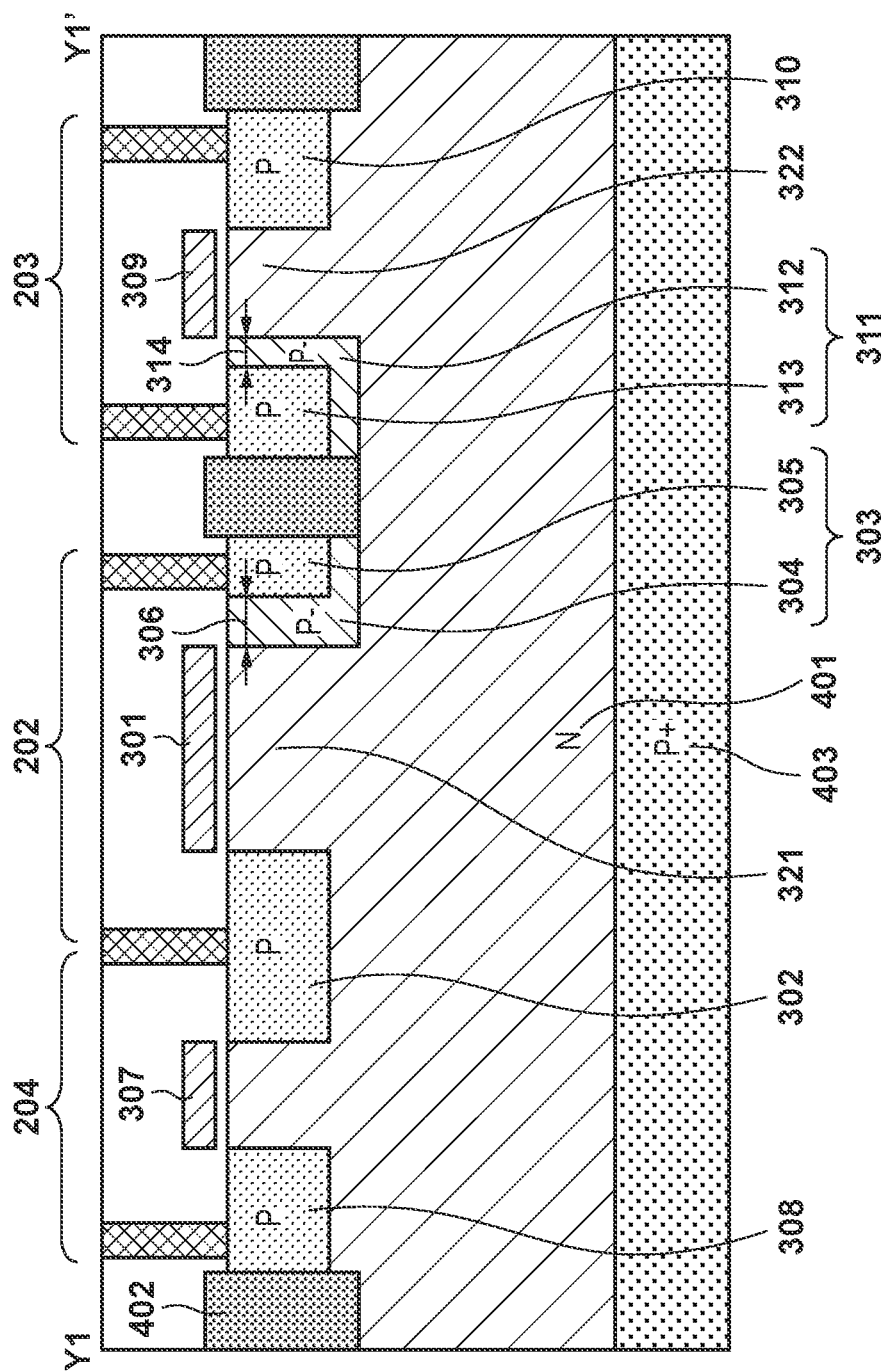
FIG. 4 is a sectional view showing an example of the arrangement of a pixel of the display apparatus in FIG. 1.

The write transistor 203, the drive transistor 202, and the light emission control transistor 204 included in each pixel 102 will be described in detail next with reference to FIGS. 3 and 4. FIG. 3 is a plan view of the pixel 102. FIG. 4 is a sectional view taken along Y1-Y1' shown in FIG. 3.

The drive transistor 202 includes two p-type diffusion regions 302 and 303 in the current path including the light-emitting element 201, the drive transistor 202, and the light emission control transistor 204. The two diffusion regions 302 and 303 each function as a main terminal (a source region or drain region). In the arrangement shown in FIGS. 3 and 4, the diffusion region 302 functions as the source region of the drive transistor 202. The diffusion region 303 functions as the drain region of the drive transistor 202. The drive transistor 202 also includes a gate electrode 301 functioning as the control terminal. As described above, the gate electrode 301 receives a luminance signal from the write transistor 203. In addition, the gate electrode 301 is connected to one of the two terminals of the capacitive element 205. The diffusion region 302 is connected to the other terminal of the capacitive element 205. The diffusion region 303 is connected to the anode of the light-emitting element 201.

The next will describe the diffusion region 303, of the two diffusion regions 302 and 303 of the drive transistor 202, which is arranged alongside the light-emitting element 201 in the current path including the light-emitting element 201, the drive transistor 202, and the light emission control transistor 204. The diffusion region 303 includes a p-type region 305 (first region) and a p⁻-type region 304 (second region) arranged between the p-type region 305 and a channel region 321 of the drive transistor 202 and having a higher resistivity than the p-type region 305. The p-type region 305 and the p⁻-type region 304 are formed from semiconductor materials having the same conductivity type as the diffusion regions of the drive transistor 202 as a p-type transistor. In other words, the p-type region 305 and the p⁻-type region 304 are formed from semiconductor materials having a conductivity type opposite to that of the channel region 321. The diffusion region 303 has an LDD (Lightly Doped Drain) structure in which the p⁻-type region 304 located alongside the channel region 321 has a lower impurity concentration than the p-type region 305. This makes the p⁻-type region 304 have a higher resistivity than the p-type region 305, as described above. The p-type region 305 may have the same impurity concentration and resistivity as those of the diffusion region 302. In this case, as shown in FIGS. 3 and 4, assume that in an orthogonal projection with respect to a substrate 403, the length of the p⁻-type region 304 in a direction in which a current flows is defined as a length 306. As shown in FIG. 4, even when the p⁻-type region 304 is formed to a lower side of the p-type region 305, the length 306 is the length of the p⁻-type region 304 between an end portion of the p-type region 305 which is located alongside the channel region 321 and an end portion of the channel region 321 which is located alongside the p-type region 305. That is, the length 306 of the p⁻-type region 304 can be the shortest length between the p-type region 305 and a portion of the drive transistor 202 in which the channel region 321 is formed.

The light emission control transistor 204 is constituted by a gate electrode 307 functioning as a control terminal, a p-type diffusion region 308 functioning as a main terminal, and the p-type diffusion region 302 functioning as a main terminal. In the arrangement shown in FIGS. 3 and 4, the diffusion region 308 functions as the source region of the light emission control transistor 204, and the diffusion region 302 functions as the drain region of the light emission control transistor 204. In this embodiment, the diffusion region 302 is shared by the drive transistor 202. However, this is not exhaustive, and the drive transistor 202 and the light emission control transistor 204 may respectively have independent diffusion regions. The diffusion region 308 is connected to the power supply potential Vdd and one of the terminals of the capacitive element 206, and the diffusion region 302 is connected to the other terminal of the capacitive element 206. In addition, the gate electrode 307 is connected to the scanning line 107. The diffusion region 308 has the same impurity concentration and resistivity as those of the diffusion region 302.

The write transistor 203 includes a gate electrode 309 functioning as a control terminal and two p-type diffusion regions 310 and 311 functioning as main terminals. The diffusion region 311 is connected to the gate electrode 301 as the control terminal of the drive transistor 202. The diffusion region 310 is connected to the signal line 108, and the gate electrode 309 is connected to the scanning line 106.

In the arrangement shown in FIGS. 3 and 4, the diffusion region 310 functions as the source region of the write transistor 203, and the diffusion region 311 functions as the drain region of the write transistor 203.

The next will describe the diffusion region 311, of the two diffusion regions 310 and 311 of the write transistor 203, which is connected to the gate electrode 301 of the drive transistor 202. The diffusion region 311 includes a p-type region 313 (third region) and p⁻-type region 312 (fourth region) arranged between the p-type region 313 and a channel region 322 of the write transistor 203 and having a higher resistivity than the p-type region 313. The p-type region 313 and the p⁻-type region 312 are formed from semiconductor materials having the same conductivity type as the diffusion regions of the write transistor 203 as a p-type transistor. In other words, the p-type region 313 and the p⁻-type region 312 are formed from semiconductor materials having a conductivity type opposite to that of the channel region 322. The diffusion region 311 has an LDD structure in which the p⁻-type region 312 has a lower impurity concentration than the p-type region 313. This makes the p⁻-type region 312 have a higher resistivity than the p-type region 313, as described above. The p-type region 313 may have the same impurity concentration and resistivity as those of the diffusion region 310. In addition, the p-type region 313 may have the same impurity concentration and resistivity as those of the diffusion regions 302 and 308 and the p-type region 305. For example, the diffusion regions 302, 308, and 310 and the p-type regions 305 and 312 may have the same impurity concentration and resistivity. In addition, the p⁻-type region 304 and the p⁻-type region 312 may have the same impurity concentration and resistivity. Matching impurity concentrations can minimize an increase in the number of processes in forming an LDD structure. In this case, as shown in FIGS. 3 and 4, in an orthogonal projection with respect to the substrate 403, the length of the p⁻-type region 312 in a direction in which a current flows is defined as a length 314. Like the length 306 described above, the length 314 is the length of the p⁻-type region 312 between an end portion of the p-type region 313 which is located alongside the channel region 322 and an end portion of the channel region 322 which is located alongside the p-type region 313. That is, the length 314 can be the shortest length of the p⁻-type region 312 between the p-type region 313 and a portion of the write transistor 203 in which the channel region 322 is formed.

In this embodiment, the write transistor 203, the drive transistor 202, and the light emission control transistor 204 are arranged in an n-type well 401 provided in the p-type substrate 403. A well contact portion 315 applies the power supply potential Vdd to the n-type well 401. An element isolation portion 402 may use STI (Shallow Trench Isolation) isolation, LOCOS (Local Oxidation Of Silicon) isolation, n-type diffusion layer isolation, or the like as appropriate.

In this embodiment, an LDD structure is used for the diffusion regions 303 and 311 functioning as the drain regions of the drive transistor 202 and the write transistor 203. This reduces an off-leakage current by relaxing an electric field at an end portion of the drain region while each drive transistor 202 is off, thereby suppressing the occurrence of bright points on a display image. In addition, arranging the p⁻-type region 304 between the p-type region 305 and the n-type well 401 reduces a junction leakage current at a p-n junction between the diffusion region 303 and the n-type well 401, thereby suppressing a junction leakage current flowing into the light-emitting element 201.

More specifically, because the drive transistor 202 operates in a saturated region at ON time, a high electric field is applied in a depletion layer in an end portion of the drain region. This tends to generate hot carriers by impact ionization. However, using an LDD structure for the diffusion region 303 can relax an electric field at an end portion of the drain region and suppress the occurrence of hot carriers, thereby suppressing a deterioration in characteristics of the drive transistor 202. Likewise, relaxing an electric field at an end portion of the drain region of the write transistor 203 can suppress variations in luminance signals caused by an off-leakage current and the like in the write transistor 203. This can improve the image quality of the display apparatus 101.

In this embodiment, the length 306 of the p$^-$-type region 304 of the drive transistor 202 is longer than the length 314 of the p$^-$-type region 312 of the write transistor 203. This can reduce resistance in the drain region of the write transistor 203 as compared with a case in which the length 314 of the p$^-$-type region 312 of the write transistor 203 is equal to the length 306 of the p$^-$-type region 304 of the drive transistor 202. That is, the above arrangement can improve the driving performance of the write transistor 203 and increase the operation speed when writing a luminance signal in the gate electrode 301 of the drive transistor 202 as compared with the case in which the length 314 is equal to the length 306.

Figure 5:
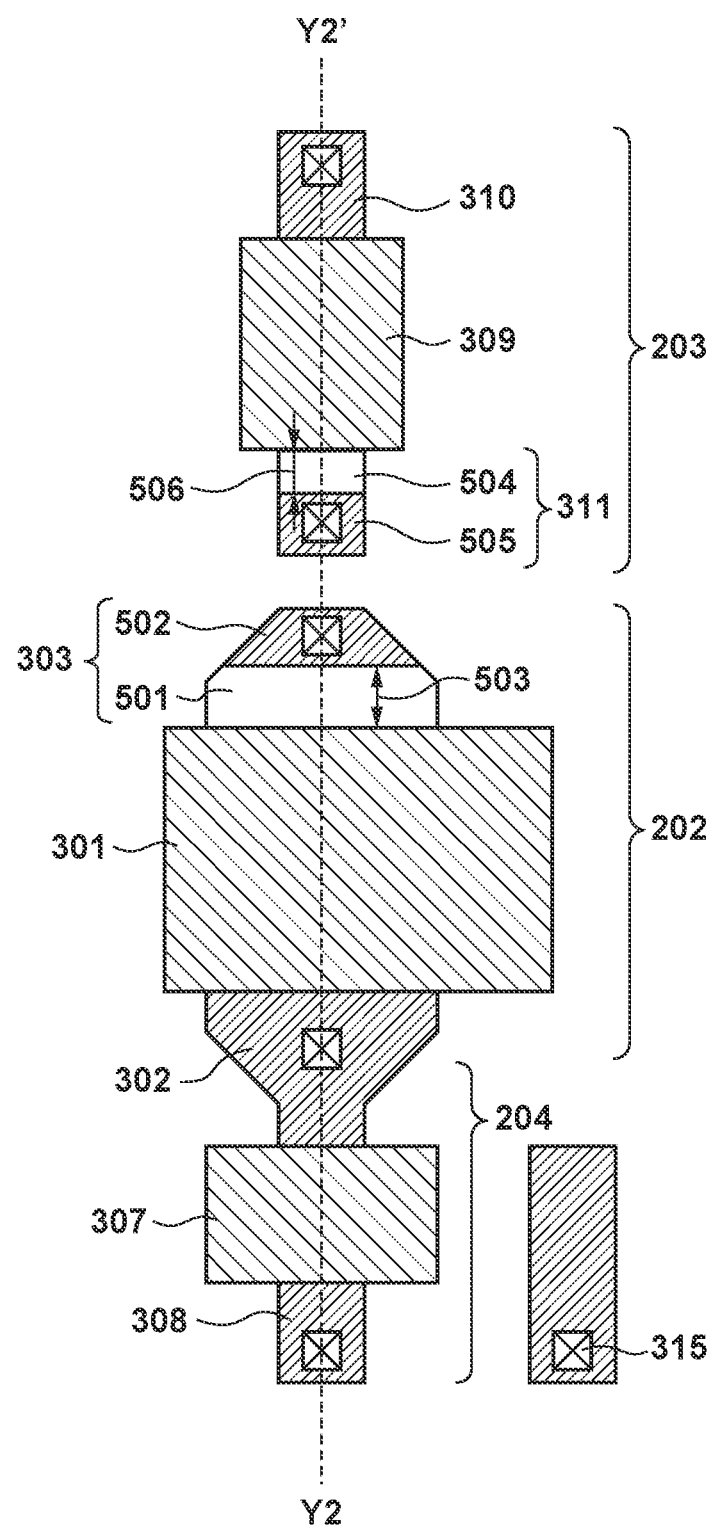
FIG. 5 is a plan view showing an example of the arrangement of a pixel of the display apparatus in FIG. 1.
Figure 6:
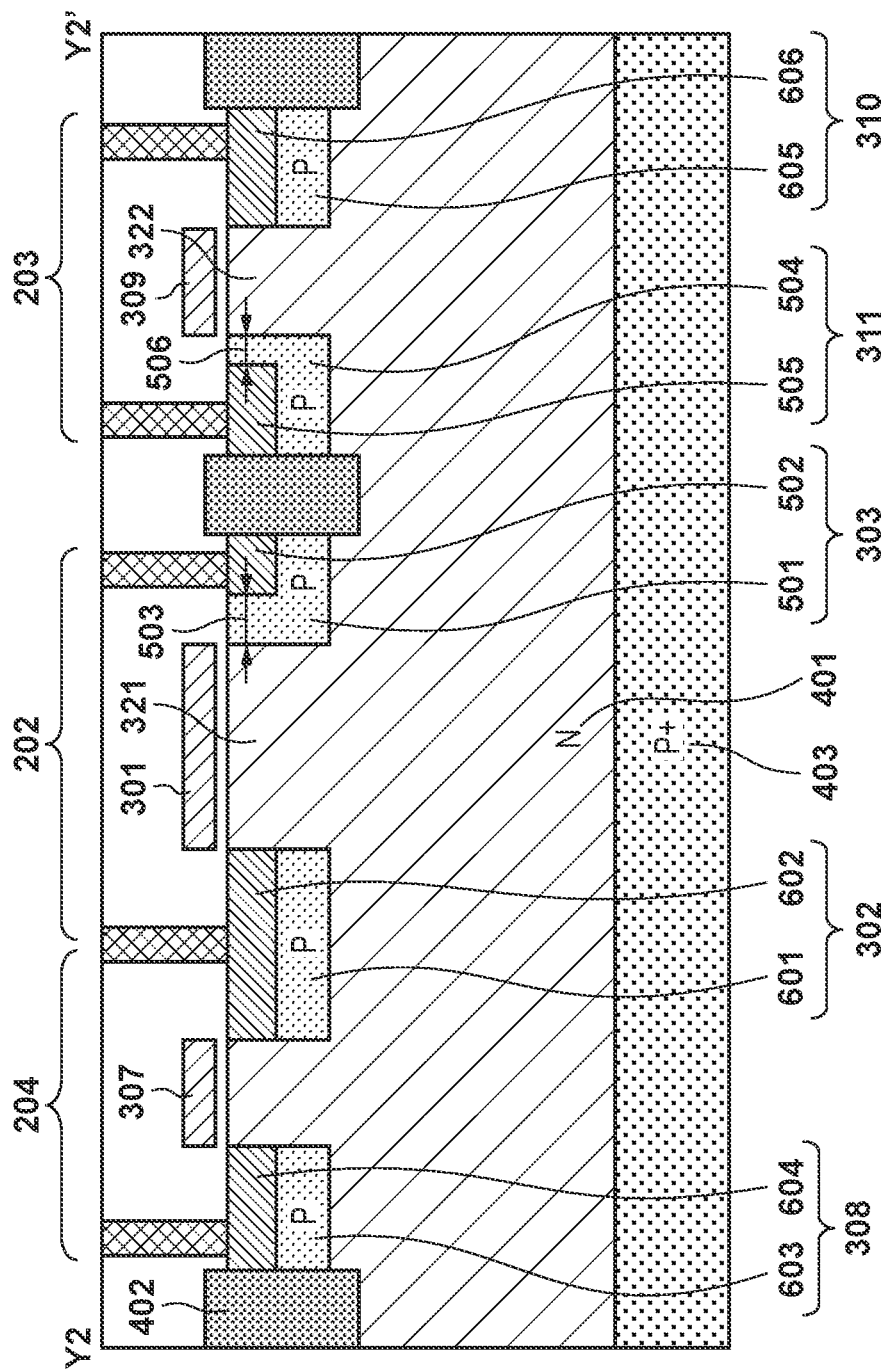
FIG. 6 is a sectional view showing an example of the arrangement of a pixel of the display apparatus in FIG. 1.

The arrangement of a display apparatus according to an embodiment of the present invention will be described with reference to FIGS. 5 and 6. FIG. 5 is a plan view of a pixel 102 of a display apparatus 101 according to the second embodiment of the present invention. FIG. 6 is a sectional view taken along Y2-Y2' shown in FIG. 5. In this embodiment, the arrangements of diffusion regions 302, 303, 308, 310, and 311 are different from those in the first embodiment described above. Arrangements other than the arrangements of the diffusion regions 302, 303, 308, 310, and 311 may be similar to those in the first embodiment described above, and hence a description will be omitted, with the following description focusing on the arrangements of the diffusion regions 302, 303, 308, 310, and 311.

The diffusion regions 302, 303, 308, 310, and 311 respectively include compound regions 502, 505, 602, 604, and 606, each formed from a compound of a semiconductor and a metal, and p-type regions 501, 504, 601, 603, and 605, each formed from a semiconductor material. The p-type regions 501, 504, 601, 603, and 605 each are a semiconductor region doped with a p-type impurity. The compound regions 502, 505, 602, 604, and 606 each are a region containing a compound formed by a reaction between a semiconductor and a metal. When, for example, a substrate 403 including the p-type regions 501, 504, 601, 603, and 605 is silicon, the compound regions 502, 505, 602, 604, and 606 may be silicide regions each formed by a reaction between a metal and a portion of a corresponding one of the p-type regions 501, 504, 601, 603, and 605. Accordingly, the compound regions 502, 505, 602, 604, and 606 have lower resistivities than the p-type regions 501, 504, 601, 603, and 605.

In this case, the diffusion region 303 (drain region) of a drive transistor 202 includes the compound region 502 (first region) and the p-type region 501 (second region) arranged between the compound region 502 and a channel region 321 of the drive transistor 202 and having a higher resistivity than the compound region 502. In addition, as shown in FIGS. 5 and 6, in an orthogonal projection with respect to the substrate 403, the length of the p-type region 501 between the compound region 502 of the p-type region 501 and the channel region 321, in a direction in which a current flows, is defined as a length 503. Likewise, the diffusion region 311 (drain region) of the write transistor 203 includes the compound region 505 (first region) and the p-type region 504 (second region) arranged between the compound region 505 and a channel region 322 of a write transistor 203 and having a higher resistivity than the compound region 505. In an orthogonal projection with respect to the substrate 403, the length of the p-type region 504 between the compound region 505 of the p-type region 504 and the channel region 322, in a direction in which a current flows, is defined as a length 506.

Like the lengths 306 and 314, the lengths 503 and 506 are lengths between end portions, of the p-type regions 501 and 504, which are located alongside the channel regions 321 and 322 of the compound regions 502 and 505, and end portions of the channel regions 321 and 322, which are located alongside the compound regions 502 and 505. That is, the length 503 can be the shortest length of the p-type region 501 between the compound region 502 and a portion of the drive transistor 202 in which the channel region 321 is formed. Likewise, the length 506 can be the shortest length of the p-type region 504 between the compound region 505 and a portion of the write transistor 203 in which the channel region 322 is formed. In the following description, in each transistor, the length of a region, of a diffusion region arranged between the channel region and the diffusion region, which has a high resistivity is the length of a portion similar to each portion having a corresponding one of the lengths 306, 314, 503, and 506.

In this specification, like the structure of the diffusion region 303, a structure in which the p-type region 501 having a higher resistivity than the compound region 502 is sandwiched between the compound region 502 and the channel region 321 is called an offset structure. In this embodiment, the diffusion regions 303 and 311 functioning as the drain regions of the drive transistor 202 and the write transistor 203 each have an offset structure. That is, respectively arranging the p-type regions 501 and 504 between the compound regions 502 and 505 and the channel regions 321 and 316 can relax electric fields at end portions of the drain regions of the drive transistor 202 and the write transistor 203. This makes it possible to obtain the same effects as those of the first embodiment described above.

In this embodiment, the length 503 of the p-type region 501 of the drive transistor 202 is longer than the length 506 of the p-type region 504 of the write transistor 203. As in the first embodiment described above, this can improve the driving performance of the write transistor 203 and increase the operation speed when writing a luminance signal in the gate electrode 301 of the drive transistor 202 as compared with the case in which the length 506 is equal to the length 503.

The p-type regions 501, 504, 601, 603, and 605 may have different or same impurity concentrations and resistivities. Different or same metal materials may be used for the compound regions 502, 505, 602, 604, and 606. However, matching the impurity concentrations of the p-type regions 501, 504, 601, 603, and 605 and metal materials used for the compound regions 502, 505, 602, 604, and 606 can suppress an increase in the number of processes.

Figure 7:
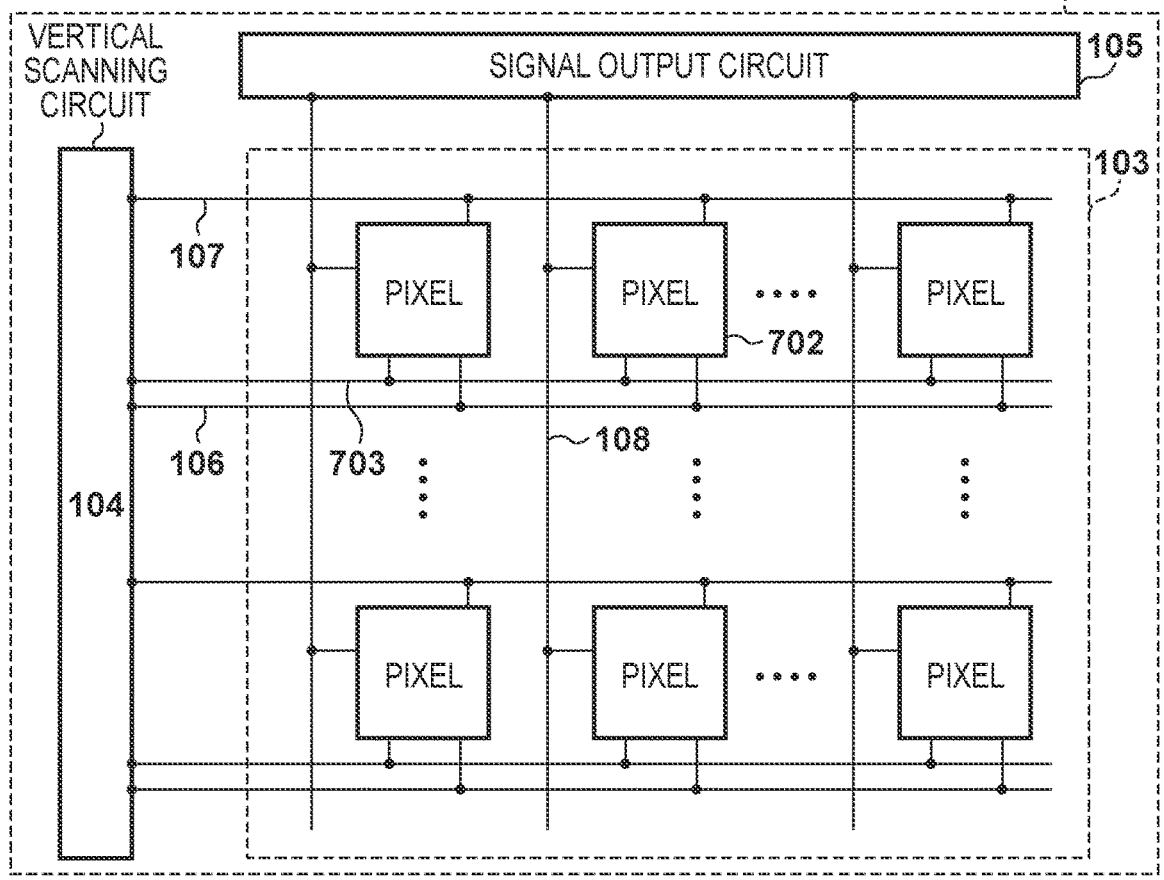
FIG. 7 is a block diagram showing an example of the arrangement of a display apparatus according to an embodiment of the present invention.
Figure 8:
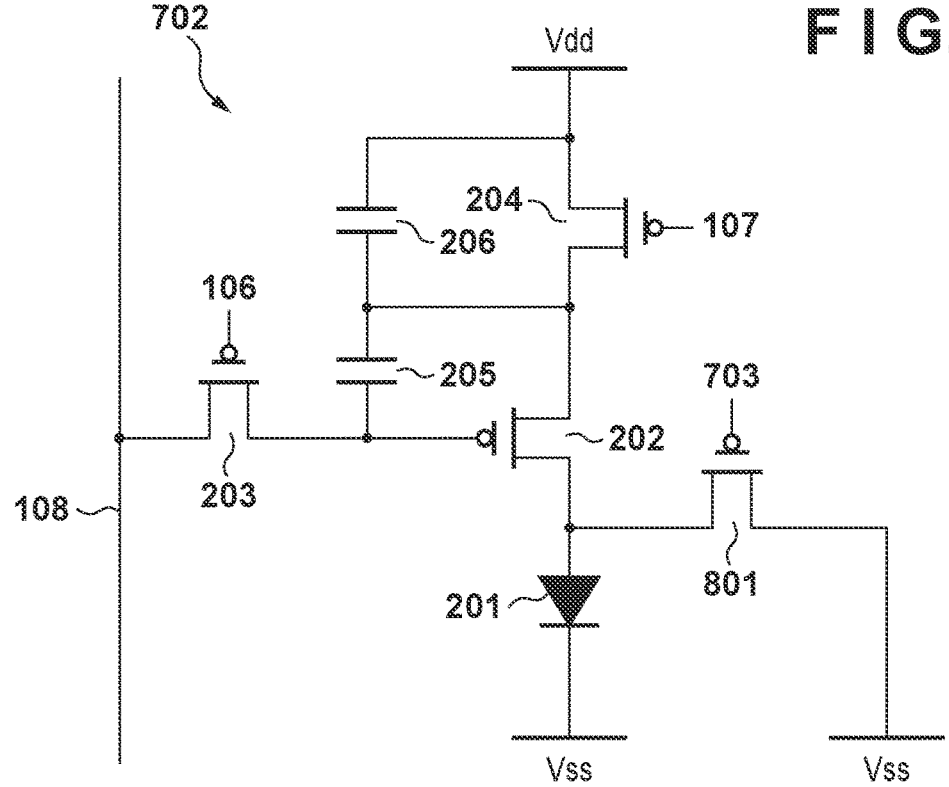
FIG. 8 is a circuit diagram showing an example of the arrangement of a pixel of the display apparatus in FIG. 7.

The arrangement of a display apparatus according to an embodiment of the present invention will be described with reference to FIGS. 7 to 10. FIG. 7 is a block diagram showing an example of the arrangement of a display apparatus 701 according to the third embodiment of the present invention. FIG. 8 is a circuit diagram of a pixel 702 arranged in the display apparatus 701. The pixel 702 of the display apparatus 701 includes a reset transistor 801 (third transistor) for connecting the anode of a light-emitting element 201 to the power supply potential Vss. A scanning line 703 for switching conduction and non-conduction of the reset transistor 801 is arranged in a pixel array unit 103 of the display apparatus 701. Arrangements other than this arrangement may be similar to those in the display apparatus 101 described above. The following description will focus on arrangements in the display apparatus 701 according to this embodiment which differ from those in the display apparatus 101 described above.

As shown in FIG. 7, in the pixel array unit 103, the scanning lines 703 extending along the row direction are arranged for each pixel row of the pixels 702 arranged in an array. The scanning lines 703 are respectively connected to output terminals of the corresponding pixel rows of a vertical scanning circuit 104 and supply reset signals to the respective pixels 702.

As shown in FIG. 8, one (the source region in the arrangement in FIG. 8) of the main terminals of the reset transistor 801 is connected to the anode of the light-emitting element 201 and one (the drain region in the arrangement in FIG. 8) of the main terminals of the drive transistor 202. The other main terminal (the drain region in the arrangement in FIG. 8) of the reset transistor 801 is connected to a power supply potential Vss. The control terminal of the reset transistor 801 is connected to the scanning line 703. In a non-emission period, rendering the reset transistor 801 conductive will connect the anode of the light-emitting element 201 to the power supply potential Vss, thereby short-circuiting the two terminals of the light-emitting element 201. This can set the light-emitting element 201 in a non-emission state (reset operation). Providing the reset transistor 801 for each pixel 702 can implement the display apparatus 701 that obtains a high contrast ratio by reliably causing each light-emitting element 201 to perform black display in a non-emission period.

Figure 9:
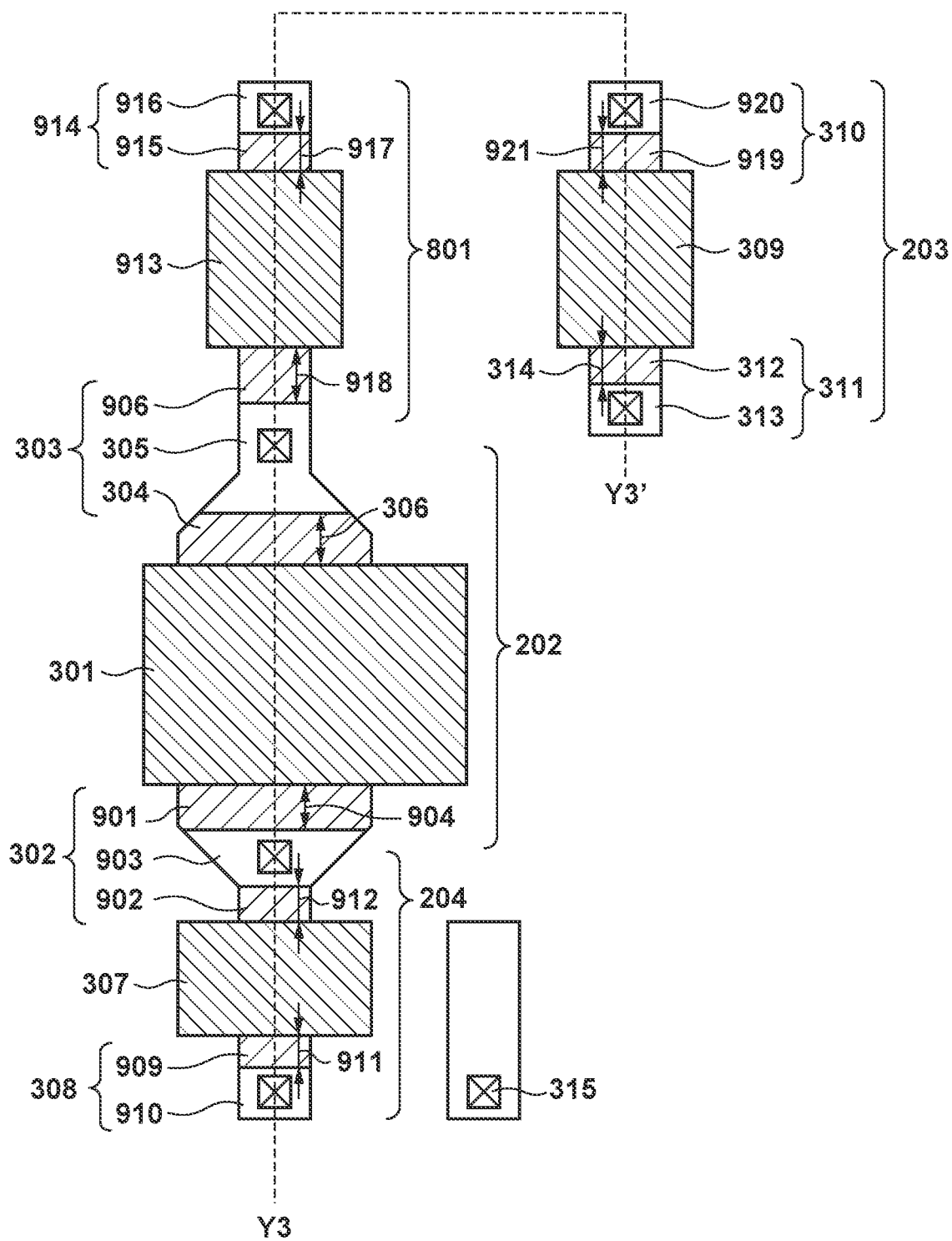
FIG. 9 is a plan view showing an example of the arrangement of a pixel of the display apparatus in FIG. 7.
Figure 10:
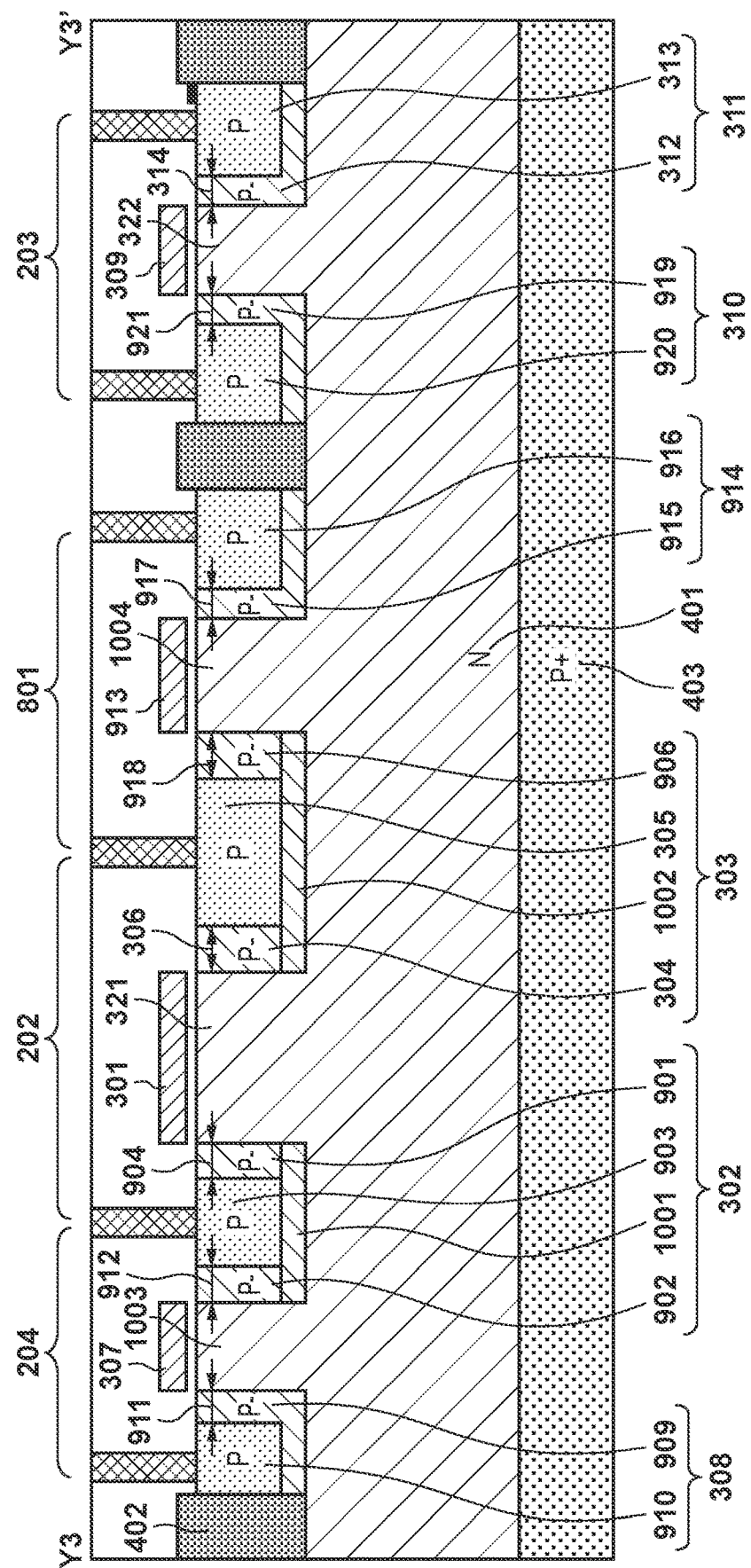
FIG. 10 is a sectional view showing an example of the arrangement of a pixel of the display apparatus in FIG. 7.

A drive transistor 202, a write transistor 203, a light emission control transistor 204, and the reset transistor 801 will be described in detail with reference to FIGS. 9 and 10. FIG. 9 is a plan view of the pixel 702. FIG. 10 is a sectional view taken along Y3-Y3' shown in FIG. 9.

Of two diffusion regions 302 and 303 of the drive transistor 202 according to this embodiment, the diffusion region 302 (source region) arranged alongside the light emission control transistor 204 has an arrangement different from that of the diffusion region 302 shown in FIGS. 3 and 4. The diffusion region 302 includes a p-type region 903 (seventh region) and a p⁻-type region 901 (eighth region) arranged between the p-type region 903 and a channel region 321 of the drive transistor 202 and having a higher resistivity than the p-type region 903. The p-type region 903 and the p⁻-type region 901 are formed from semiconductor materials having the same conductivity type as the diffusion regions of the drive transistor 202 as a p-type transistor. In other words, the p-type region 903 and the p⁻-type region 901 are formed from semiconductor materials having a conductivity type opposite to that of the channel region 321. In addition, the diffusion region 303 has an LDD structure in which the p⁻-type region 901 has a lower impurity concentration than the p-type region 903. This makes the p⁻-type region 901 have a higher resistivity than the p-type region 903, as described above. The p-type region 903 may have the same impurity concentration and resistivity as those of a p-type region 305 of the diffusion region 303. In addition, the p⁻-type region 901 and a p⁻-type region 304 may have the same impurity concentration and resistivity. Matching the impurity concentrations can minimize an increase in the number of processes when forming an LDD structure. In this case, as shown in FIGS. 9 and 10, in an orthogonal projection with respect to a substrate 403, the length of the p⁻-type region 901 in a direction in which a current flows is defined as a length 904.

Two diffusion regions 302 and 308 of the light emission control transistor 204 each have an LDD structure, unlike the pixel 102 of the display apparatus 101 described above. The first will describe the diffusion region 302, of the two diffusion regions 302 and 308 of the light emission control transistor 204, which is arranged alongside the light-emitting element 201 in a current path including the light-emitting element 201, the drive transistor 202, and the light emission control transistor 204. Although the diffusion region 302 is shared by the drive transistor 202, a portion of the diffusion region 302 which functions as the drain region of the light emission control transistor 204 will be described below. The diffusion region 302 includes a p-type region 903 (13th region) and a p⁻-type region 902 (14th region) arranged between the p-type region 903 and a channel region 1003 of the light emission control transistor 204 and having a higher resistivity than the p-type region 903. The next will describe the diffusion region 308 (source region) of the two diffusion regions 302 and 308 of the light emission control transistor 204. The diffusion region 308 includes a p-type region 910 (15th region) and a p⁻-type region 909 (16th region) arranged between the p-type region 910 and the channel region 1003 of the light emission control transistor 204. The diffusion region 308 is connected to a power supply potential Vdd. The p⁻-type region 909 has a higher resistivity than the p-type region 910.

The p-type regions 903 and 910 and the p⁻-type regions 902 and 909 are formed from semiconductor materials having the same conductivity type as the diffusion regions of the light emission control transistor 204 as a p-type transistor. In other words, the p-type regions 903 and 910 and the p⁻-type regions 902 and 909 are formed from semiconductor materials having a conductivity type opposite to that of the channel region 1003. In addition, the diffusion regions 302 and 308 respectively have LDD structures in which the p⁻-type regions 902 and 909 have lower impurity concentrations than the p-type regions 903 and 910. This makes the p⁻-type regions 902 and 909 have higher resistivities than the p-type regions 903 and 910. The p-type region 910 may have the same impurity concentration and resistivity as those of the p-type region 903. The p⁻-type regions 902 and 909 each may have the same impurity concentration and resistivity as those of the p⁻-type region 901. Matching impurity concentrations can minimize an increase in the number of processes when forming an LDD structure. In this case, as shown in FIGS. 9 and 10, in an orthogonal projection with respect to the substrate 403, the length of the p⁻-type region 902 in a direction in which a current flows is defined as a length 912. In addition, in an orthogonal projection with respect to the substrate 403, the length of the p⁻-type region 909 in a direction in which a current flows is defined as a length 911.

The arrangement of the reset transistor 801 will be described next. The reset transistor 801 includes two diffusion regions 303 and 914 and a gate electrode 913. The first will describe the diffusion region 303, of the two diffusion regions 303 and 914 of the reset transistor 801, which is connected to the light-emitting element 201. The diffusion region 303 is shared by the drive transistor 202. A portion of the diffusion region 303 which functions as the source region of the reset transistor 801 will be described here. The diffusion region 303 includes a p-type region 305 (ninth region) and a p⁻-type region 906 (10th region) arranged between the p-type region 305 and a channel region 1004 of the reset transistor 801 and having a higher resistivity than the p-type region 305. The next will describe the diffusion region 914 (drain region) of the two diffusion regions 303 and 914 of the reset transistor 801. The diffusion region 914 includes a p-type region 916 (11th region) and a p⁻-type region 915 (12th region) arranged between the p-type region 916 and the channel region 1004 of the reset transistor 801. The diffusion region 914 is connected to the power supply potential Vss. The p⁻-type region 915 has a higher resistivity than the p-type region 916.

The p-type regions 305 and 916 and the p⁻-type regions 906 and 915 are formed from semiconductor materials having the same conductivity type as diffusion regions of the reset transistor 801 as a p-type transistor. In other words, the p-type regions 305 and 916 and the p⁻-type regions 906 and 915 are formed from semiconductor materials having a conductivity type opposite to that of the channel region 1004. In addition, the diffusion regions 303 and 914 respectively have LDD structures in which the p⁻-type regions 906 and 915 have lower impurity concentrations than the p-type regions 305 and 916. This makes the p⁻-type regions 906 and 915 have higher resistivities than the p-type regions 305 and 916. The p-type region 916 may have the same impurity concentration and resistivity as those of the p-type region 305. The p⁻-type regions 906 and 915 each may have the same impurity concentration and resistivity as those of the p⁻-type region 304. Matching impurity concentrations can minimize an increase in the number of processes when forming an LDD structure. In this case, as shown in FIGS. 9 and 10, in an orthogonal projection with respect to the substrate 403, the length of the p⁻-type region 906 in a direction in which a current flows is defined as a length 918. In addition, in an orthogonal projection with respect to the substrate 403, the length of the p⁻-type region 915 in a direction in which a current flows is defined as a length 917.

Of two diffusion regions 310 and 311 of the write transistor 203 according to this embodiment, the diffusion region 310 connected to the signal line 108 has an arrangement different from that of the diffusion region 310 shown in FIGS. 3 and 4. The diffusion region 310 (source region) includes a p-type region 920 (17th region) and a p⁻-type region 919 (18th region) arranged between the p-type region 920 and a channel region 322 of the write transistor 203 and having a higher resistivity than the p-type region 920. The p-type region 920 and the p⁻-type region 919 are formed from semiconductor materials having the same conductivity type as the diffusion regions of the write transistor 203 as a p-type transistor. In other words, the p-type region 920 and the p⁻-type region 919 are formed from semiconductor materials having a conductivity type opposite to that of the channel region 322. In addition, the diffusion region 310 has an LDD structure in which the p⁻-type region 919 has a lower impurity concentration than the p-type region 920. This makes the p⁻-type region 919 have a higher resistivity than the p-type region 920, as described above. The p-type region 920 may have the same impurity concentration and resistivity as those of a p-type region 313 of the diffusion region 311. In addition, the p-type region 910 and the p-type region 920 may have the same impurity concentration and resistivity. That is, the p-type regions 305, 313, 903, 910, 916, and 920 included in the pixel 702 may have the same impurity concentration. The p⁻-type regions 304, 312, 901, 902, 906, 909, 915, and 919 included in the pixel 702 may have the same impurity concentration. Matching the impurity concentrations can minimize an increase in the number of processes when forming an LDD structure. In this case, as shown in FIGS. 9 and 10, in an orthogonal projection with respect to the substrate 403, the length of the p⁻-type region 919 in a direction in which a current flows is defined as a length 921.

In this embodiment, the length 306 of the p⁻-type region 304, of the diffusion region 303, which functions as the drain region of the drive transistor 202 is longer than the length 904 of the p⁻-type region 901, of the diffusion region 302, which functions as the source region. In other words, the length 904 is shorter than the length 306. In the source region to which a high electric field is difficult to apply, the length 904 of the p⁻-type region 901 having a high resistivity in the LDD structure is reduced. This makes it possible to suppress the resistance inserted in the source region of the drive transistor 202 and improve the driving performance of the drive transistor 202 in an emission period.

The length 918 of the p⁻-type region 906, of the diffusion region 303, which functions as the source region of the reset transistor 801 is longer than the length 314 of the p⁻-type region 312, of the diffusion region 311, which functions as the drain region of the write transistor 203. This makes it possible to relax the electric field applied to the diffusion region 303 as the source region of the reset transistor 801 while the reset transistor 801 is off in an emission period. This reduces a junction leakage current at a p-n junction between the diffusion region 303 and the n-type well 401, thereby suppressing a junction leakage current flowing into the light-emitting element 201.

The length 306 of the p⁻-type region 304, of the diffusion region 303, which functions as the drain region of the drive transistor 202 is longer than the length 912 of the p⁻-type region 902, of the diffusion region 302, which functions as the drain region of the light emission control transistor 204. In addition, the length 918 of the p⁻-type region 906, of the diffusion region 303, which functions as the source region of the reset transistor 801 is longer than the length 912 of the p⁻-type region 902, of the diffusion region 302, which functions as the drain region of the light emission control transistor 204. In an emission period in which the light-emitting element 201 is caused to emit light, the light emission control transistor 204 performs an ON operation in a linear region. This makes it difficult to apply a high electric field in a depletion layer in an end portion, of the diffusion region 302, which is located alongside the channel region 1003 and functions as the drain region of the light emission control transistor 204, and also makes it difficult to cause impact ionization. Accordingly, the length 912 of the p⁻-type region 902 is reduced to reduce the resistance inserted in the drain region of the light emission control transistor 204 and improve the driving performance of the light emission control transistor 204. This makes it possible to increase the operation speed at the time of transition from a non-emission period to an emission period.

The length 911 of the p⁻-type region 909, of the diffusion region 308, which functions as the source region of the light emission control transistor 204 is equal to or less than the length 314 of the p⁻-type region 312, of the diffusion region 311, which functions as the drain region of the write transistor 203. Likewise, the length 917 of the p⁻-type region 915, of the diffusion region 914, which functions as the drain region of the reset transistor 801, is equal to or less than the length 314 of the p⁻-type region 312, of the diffusion region 311, which functions as the drain region of the write transistor 203. In other words, the lengths 911 and 917 may be shorter than the lengths 306, 314, 904, 912, 918, and 921 of the p⁻-type regions 304, 312, 901, 902, 906, and 919 of other transistors arranged in the pixel 702. In a non-emission period, while the light emission control transistor 204 is off, the power supply potential Vdd connected to the diffusion region 308 absorbs a junction leakage current between the well 401 and the diffusion region 308 functioning as the source region, which is multiplied by an electric field. In an emission period, while the reset transistor 801 is off, the power supply potential Vss connected to the diffusion region 914 absorbs a junction leakage current between the well 401 and the diffusion region 914 functioning as the drain region, which is multiplied by an electric field. Therefore, reducing the lengths 911 and 917 can improve the driving performance of the light emission control transistor 204 and the reset transistor 801 without damaging the characteristics of the display apparatus 701.

The length 917 of the p⁻-type region 915, of the diffusion region 914, which functions as the drain region of the reset transistor 801 may be longer than the length 911 of the p⁻-type region 909, of the diffusion region 308, which functions as the source region of the light emission control transistor 204. A potential difference |Vss−Vdd| between the well 401 and the diffusion region 914 of the reset transistor 801 is larger than a potential difference |Vdd−Vdd| between the well 401 and the diffusion region 308 of the light emission control transistor 204. Making the length 917 longer than the length 911 can reduce a junction leakage current between the well 401 and the diffusion region 914 of the reset transistor 801 and reduce the consumption current of the display apparatus 701.

The length 921 of the p⁻-type region 919, of the diffusion region 310, which functions as the source region of the write transistor 203, is longer than the length 314 of the p⁻-type region 312, of the diffusion region 311, which functions as the drain region. This reduces the parasitic capacitance between the gate electrode 309 and the signal line 108 connected to the diffusion region 310 and improves the driving performance of the write transistor 203. This makes it possible to increase the operation speed when sampling a luminance signal at the gate electrode 301 (capacitive element 205) of the drive transistor 202 at the time of switching the signal potential of the signal line 108 for each frame.

As shown in FIG. 10, the p⁻-type region 901 and the p⁻-type region 902 constituting parts of the diffusion region 302 may be connected to each other via a p⁻-type region 1001. Likewise, the p⁻-type region 304 and the p⁻-type region 906 constituting parts of the diffusion region 303 may be connected to each other via a p⁻-type region 1002. This makes it possible to relax electric fields between the diffusion regions 302 and 303 and the well 401 and suppress a junction leakage current.

In this embodiment, in all the transistors arranged in each pixel 702, each diffusion region includes a region having a low resistivity and a region arranged closer to the channel region of each transistor than the region having the low resistivity and having a higher resistivity than the region having the low resistivity. The p⁻-type region having the high resistivity has the above relationship to suppress an off-leakage current and a junction leakage current in each transistor, thereby improving the driving performance of the transistor. This can implement the image quality of the display apparatus 701.

Figure 11:
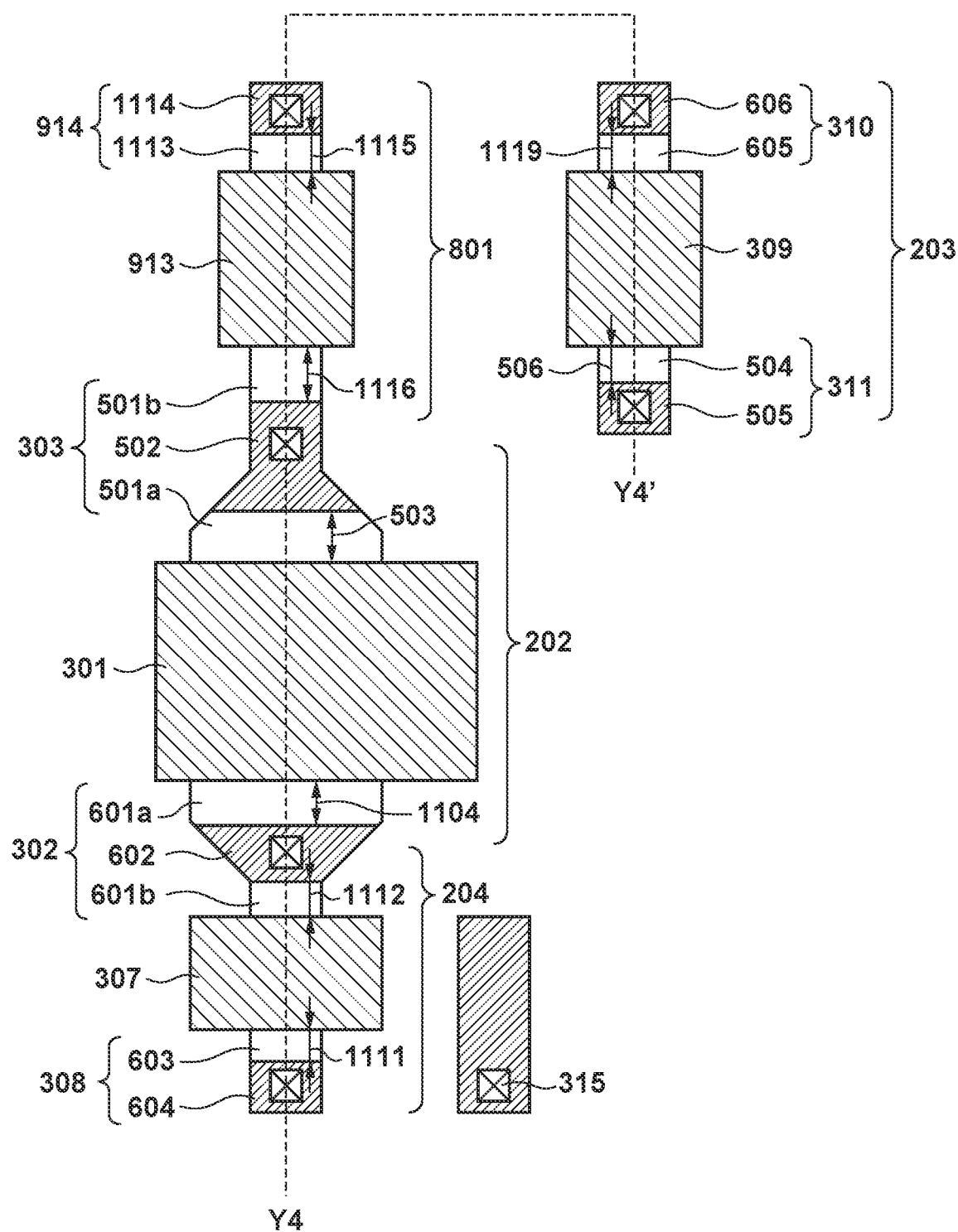
FIG. 11 is a plan view showing an example of the arrangement of a pixel of the display apparatus in FIG. 7.
Figure 12:
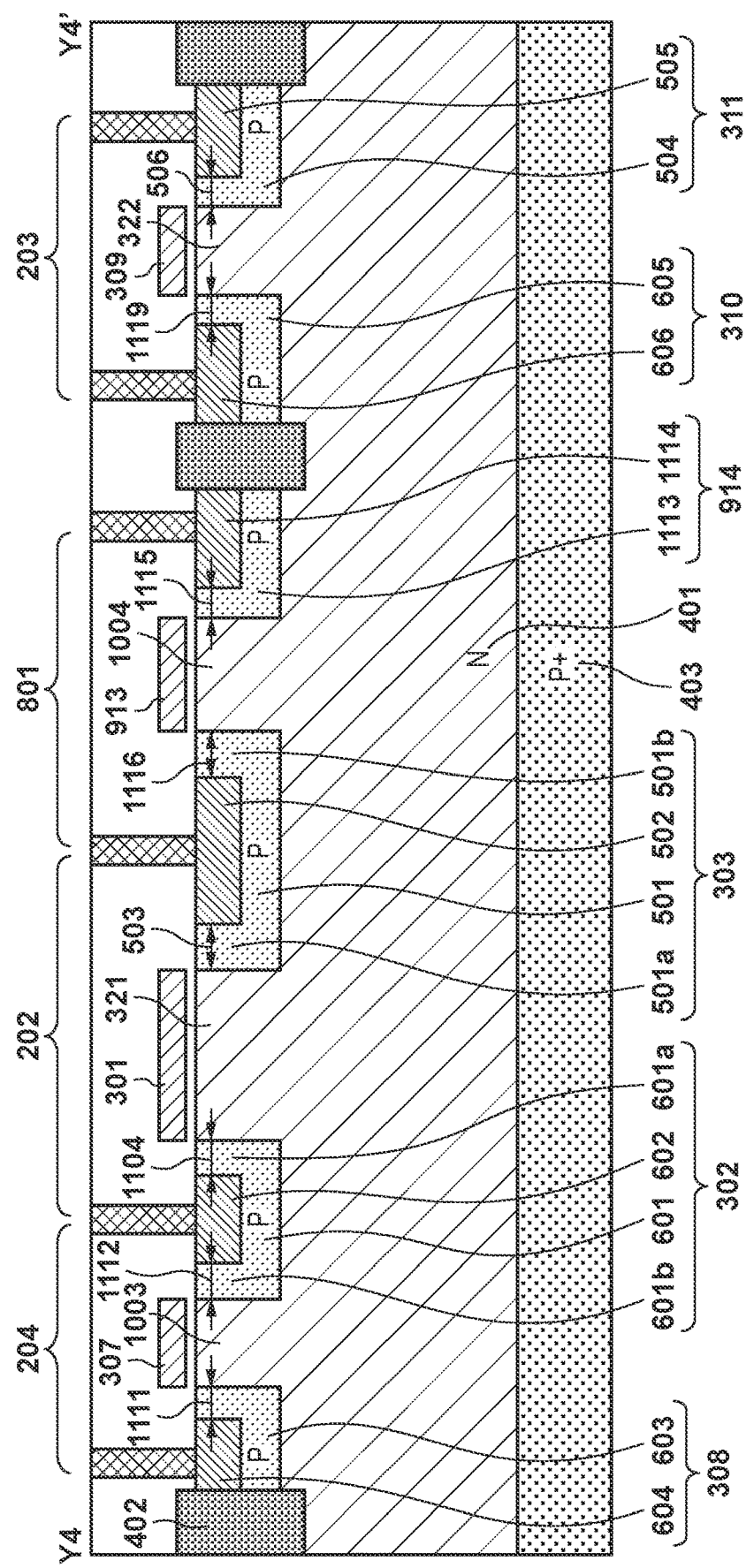
FIG. 12 is a sectional view showing an example of the arrangement of a pixel of the display apparatus in FIG. 7.

The arrangement of a display apparatus according to an embodiment of the present invention will be described with reference to FIGS. 11 and 12. FIG. 11 is a plan view of a pixel 702 of a display apparatus 701 according to the fourth embodiment of the present invention. FIG. 12 is a sectional view taken along Y4-Y4' shown in FIG. 11. In this embodiment, diffusion regions 302, 303, 308, 310, 311, and 914 include offset structures like the diffusion regions 303 and 311 according to the second embodiment described above. The fourth embodiment is the same as the third embodiment described except for the arrangements of the diffusion regions 302, 303, 308, 310, 311, and 914, and hence a description will be omitted, with the following description focusing on the arrangements of the diffusion regions 302, 303, 308, 310, 311, and 914.

The diffusion region 302 (source region) of a drive transistor 202 includes a p-type region 601 and a compound region 602, and is shared as the drain region of a light emission control transistor 204. A p-type region 601a of the p-type region 601 is arranged between a channel region 321 and the compound region 602. In this case, as shown in FIGS. 11 and 12, in an orthogonal projection with respect to a substrate 403, the length of the p-type region 601a in a direction in which a current flows is defined as a length 1104. The diffusion region 303 (drain region) includes a p-type region 501 and a compound region 502, and is shared as the source region of a reset transistor 801. A p-type region 501a of the p-type region 501 is arranged between the channel region 321 and the compound region 502. As in the second embodiment described above, in an orthogonal projection with respect to the substrate 403, the length of the p-type region 501a in a direction in which a current flows is defined as a length 503.

The diffusion region 308 (source region) of the light emission control transistor 204 has a p-type region 603 and a compound region 604. The p-type region 603 is arranged between a channel region 1003 and the compound region 604. As shown in FIGS. 11 and 12, in an orthogonal projection with respect to the substrate 403, the length of the p-type region 603 in a direction in which a current flows is defined as a length 1111. In a portion, of the diffusion region 302 shared by the drive transistor 202, which functions as the drain region of the light emission control transistor 204, a p-type region 601b of the p-type region 601 is arranged between the channel region 1003 and the compound region 602. As shown in FIGS. 11 and 12, in an orthogonal projection with respect to the substrate 403, the length of the p-type region 601b in a direction in which a current flows is defined as a length 1112.

The diffusion region 914 (drain region) of the reset transistor 801 includes a p-type region 1113 and a compound region 1114. The p-type region 1113 is arranged between the channel region 1004 and the compound region 1114. As shown in FIGS. 11 and 12, in an orthogonal projection with respect to the substrate 403, the length of the p-type region 1113 in a direction in which a current flows is defined as a length 1115. In a portion, of the diffusion region 303 shared by the drive transistor 202, which functions as the source region of the reset transistor 801, a p-type region 501b of the p-type region 501 is arranged between the channel region 1004 and the compound region 502. As shown in FIGS. 11 and 12, in an orthogonal projection with respect to the substrate 403, the length of the p-type region 501b in a direction in which a current flows is defined as a length 1116.

The diffusion region 310 (source region) of a write transistor 203 includes a p-type region 605 and a compound region 606. The p-type region 605 is arranged between a channel region 322 and the compound region 606. As shown in FIGS. 11 and 12, in an orthogonal projection with respect to the substrate 403, the length of the p-type region 605 in a direction in which a current flows is defined as a length 1119. The diffusion region 311 (drain region) includes a p-type region 504 and a compound region 505 as in the second embodiment described above. The p-type region 504 is arranged between the channel region 322 and the compound region 505. As in the second embodiment described above, in an orthogonal projection with respect to the substrate 403, the length of the p-type region 504 in a direction in which a current flows is defined as a length 506.

As in the third embodiment, a length 1108 of the p-type region 501a, of the diffusion region 303, which functions as the drain region is longer than the length 1104 of the p-type region 601a, of the diffusion region 302, which functions as the source region of the drive transistor 202. In addition, the length 1116 of the p-type region 501b, of the diffusion region 303, which functions as the source region of the reset transistor 801 is longer than the length 506 of the p-type region 504, of the diffusion region 311, which functions as the drain region of the write transistor 203. Furthermore, the length 503 of the p-type region 501a, of the diffusion region 303, which functions as the drain region of the drive transistor 202 is longer than the length 1112 of the p-type region 601b of the diffusion region 302, which function as the drain region of the light emission control transistor 204. Moreover, the length 1104 of the p-type region 501b, of the diffusion region 303, which function as the source region of the reset transistor 801 is longer than the length 1112 of the p-type region 601b, of the diffusion region 302, which functions as the drain region of the light emission control transistor 204.

The length 1111 of the p-type region 603, of the diffusion region 308, which functions as the source region of the light emission control transistor 204 is equal to or less than the length 506 of the p-type region 504, of the diffusion region 311, which functions as the drain region of the write transistor 203. Likewise, the length 1115 of the p-type region 1113, of the diffusion region 914, which functions as the drain region of the reset transistor 801 is equal to or less than the length 506 of the p-type region 504, of the diffusion region 311, which functions as the drain region of the write transistor 203. In other words, the lengths 1111 and 1115 may be shorter than the lengths 503, 1116, 506, 1119, 1104, and 1112 of the p-type regions 501a, 501b, 504, 605, 601a, and 601b of other transistors arranged in the pixel 702. In addition, the length 1115 of the p-type region 1113, of the diffusion region 914, which functions as the drain region of the reset transistor 801 may be longer than the length 1111 of the p-type region 603, of the diffusion region 308, which functions as the source region of the light emission control transistor 204. Furthermore, the length 1119 of the p-type region 605, of the diffusion region 310, which functions as the source region of the write transistor 203 is longer than the length 506 of the p-type region 504, of the diffusion region 311, which functions as the drain region.

As shown in FIG. 12, the p-type region 601a and the p-type region 601b constituting parts of the diffusion region 302 may be continuous. Likewise, the p-type region 501a and the p-type region 501b constituting parts of the diffusion region 303 may be continuous. For example, the respective regions can be formed by reacting a metal with part of each of the p-type regions 601 and 501 after formation of them.

The p-type regions 501, 504, 601, 603, 605, and 1113 may have different or same impurity concentrations and resistivities. Different or same metal materials may be used for the compound regions 502, 505, 602, 604, 606, and 1114. However, an increase in the number of processes can be suppressed by matching the impurity concentrations of the p-type regions 501, 504, 601, 603, 605, and 1113 and the metal materials used for the compound regions 502, 505, 602, 604, 606, and 1114.

This embodiment can also obtain the same effects as those of the third embodiment with the above arrangements. This makes it possible to improve the image quality of the display apparatus 701.

Figure 13:
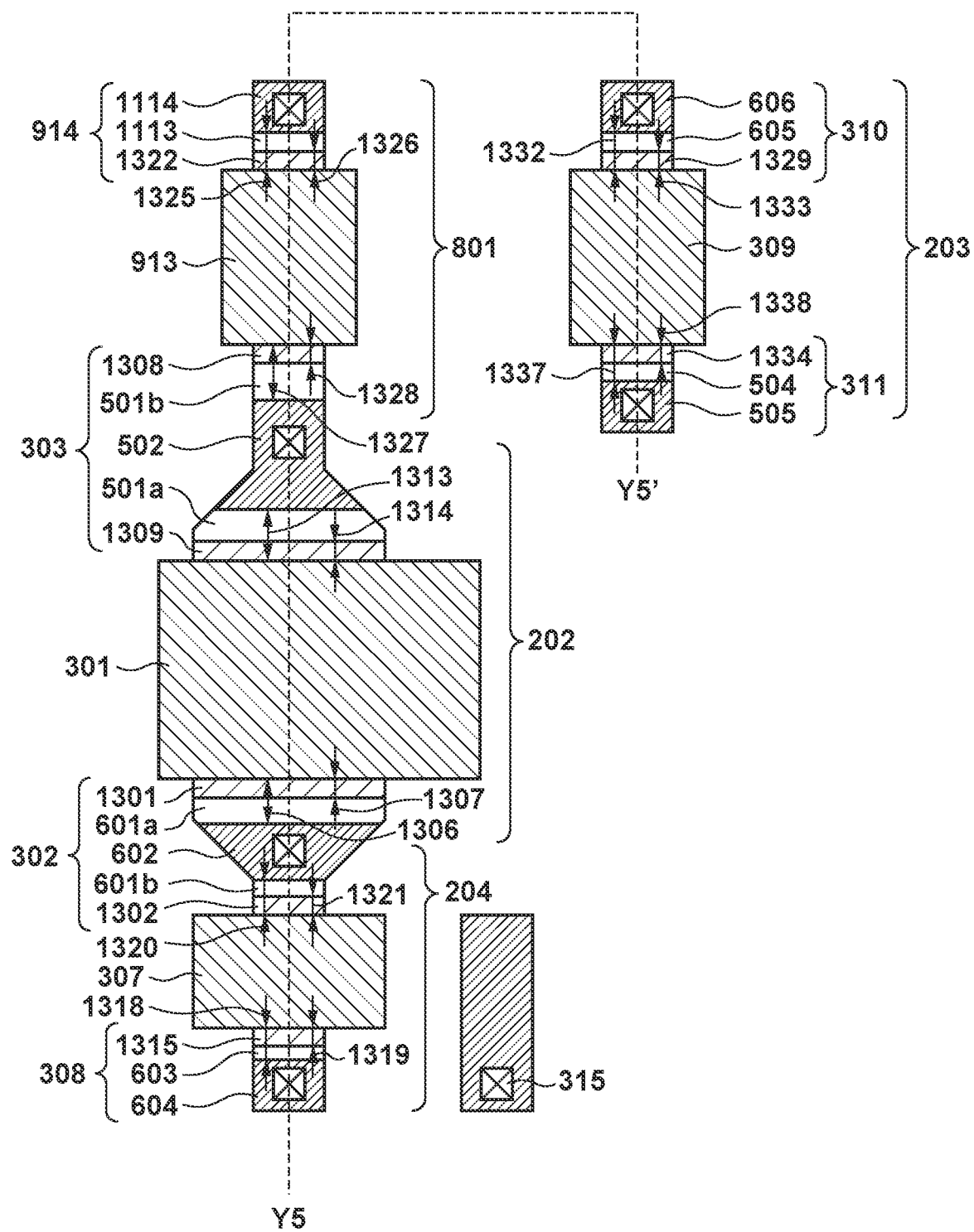
FIG. 13 is a plan view showing an example of the arrangement of a pixel of the display apparatus in FIG. 7.
Figure 14:
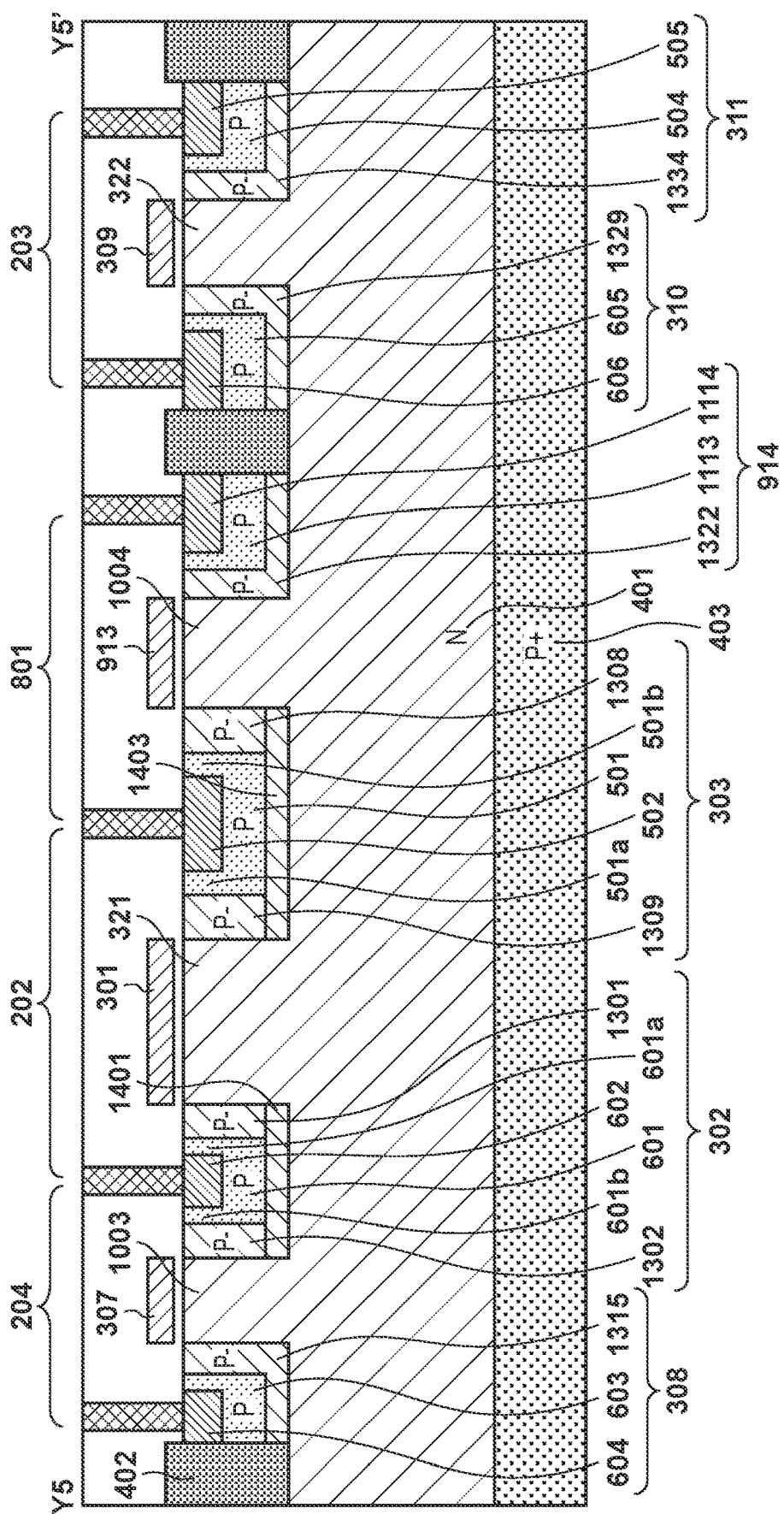
FIG. 14 is a sectional view showing an example of the arrangement of a pixel of the display apparatus in FIG. 7.

The arrangement of a display apparatus according to an embodiment of the present invention will be described with reference to FIGS. 13 and 14. FIG. 13 is a plan view of a pixel 702 of a display apparatus 701 according to the fifth embodiment. FIG. 14 is a sectional view taken along Y5-Y5' shown in FIG. 13. In this embodiment, a p$^-$-type region is arranged in a diffusion region of each transistor, unlike in the fourth embodiment. Arrangements other than this may be similar to those in the fourth embodiment described above, and hence the following description will focus on arrangements different from those in the fourth embodiment.

A diffusion region 302 functioning as the source region of a drive transistor 202 and the drain region of a light emission control transistor 204 includes p$^-$-type regions 1301 and 1302, a p-type region 601, and a compound region 602. In a portion of the diffusion region 302 which functions as the source region of the drive transistor 202, the p$^-$-type region 1301, a p-type region 601a, and the compound region 602 are arranged in this order from a side of a channel region 321 along a direction in which a current flows. That is, in a portion of the diffusion region 302 which functions as the source region of the drive transistor 202, the p-type region 601a is arranged between the p$^-$-type region 1301 and the compound region 602. In other words, the diffusion region 302 further includes the p$^-$-type region 1301 having a higher resistivity than the p-type region 601a between the p-type region 601a and the channel region 321, unlike in the fourth embodiment described above. That is, in an orthogonal projection with respect to a substrate 403, a length 1306 from the channel region 321 to the compound region 602 is longer than a length 1307 of the p-type region 601a. The p$^-$-type region 1301 is formed from a semiconductor material having the same conductivity type as that of the p-type region 601a and has a lower impurity concentration than the p-type region 601a. The p-type region 601a and the p$^-$-type region 1301 are formed from semiconductor materials having a conductivity type opposite to that of the channel region 321. This makes it possible to relax an electric field at an end portion of the source region of the drive transistor 202 and reduce an off-leakage current in the drive transistor 202 while the drive transistor 202 is off in an emission period.

A diffusion region 303 functioning as the drain region of the drive transistor 202 and the source region of a reset transistor 801 includes p$^-$-type regions 1308 and 1309, a p-type region 501, and a compound region 502. In a portion, of the diffusion region 303, which functions as the drain region of the drive transistor 202, the p$^-$-type region 1309, a p-type region 501a, and the compound region 502 are arranged in this order from a side of the channel region 321 along a direction in which a current flows. That is, in a portion, of the diffusion region 303, which functions as the drain region of the drive transistor 202, the p-type region 501a is arranged between the p$^-$-type region 1309 and the compound region 502. In other words, the diffusion region 303 further includes the p$^-$-type region 1309 (fifth region) arranged between the p-type region 501a (second region) and the channel region 321 of the drive transistor 202 and having a higher resistivity than the p-type region 501a. That is, in an orthogonal projection with respect to the substrate 403, a length 1313 from the channel region 321 to the compound region 502 is longer than a length 1314 of the p-type region 501a. The p⁻-type region 1309 is formed from a semiconductor material having the same conductivity type as that of the p-type region 501a and has a lower impurity concentration than the p-type region 501a. The p-type region 501a and the p⁻-type region 1309 are formed from semiconductor materials having a conductivity type opposite to that of the channel region 321. This makes it possible to relax an electric field at an end portion of the drain region of the drive transistor 202 and reduce an off-leakage current in the drive transistor 202 while the drive transistor 202 is off in an emission period.

A diffusion region 308 functioning as the source region of the light emission control transistor 204 includes a p⁻-type region 1315, a p-type region 603, and a compound region 604. The p⁻-type region 1315, the p-type region 603, and the compound region 604 are arranged in this order from a side of a channel region 1003 along a direction in which a current flows. That is, in the diffusion region 308 functioning as the source region of the light emission control transistor 204, the p-type region 603 is arranged between the p⁻-type region 1315 and the compound region 604. In other words, the diffusion region 308 further includes the p⁻-type region 1315 having a higher resistivity than the p-type region 603 between the p-type region 603 and the channel region 1003, unlike in the fourth embodiment described above. That is, in an orthogonal projection with respect to the substrate 403, a length 1318 from the channel region 1003 to the compound region 604 is longer than a length 1319 of the p-type region 603. The p⁻-type region 1315 is formed from a semiconductor material having the same conductivity type as that of the p-type region 603 and has a lower impurity concentration than the p-type region 603. The p-type region 603 and the p⁻-type region 1315 are formed from semiconductor materials having a conductivity type opposite to that of the channel region 1003. This makes it possible to relax an electric field at an end portion of the source region of the light emission control transistor 204 and reduce an off-leakage current between the diffusion region 308 and the well 401 while the light emission control transistor 204 is off in a non-emission period.

In a portion, of the diffusion region 302, which functions as the drain region of the light emission control transistor 204, the p⁻-type region 1302, a p-type region 601b, and the compound region 602 are arranged in this order from a side of the channel region 1003 along a direction in which a current flows. That is, in a portion, of the diffusion region 302, which functions as the drain region of the light emission control transistor 204, the p-type region 601a is arranged between the p⁻-type region 1302 and the compound region 602. In other words, the diffusion region 302 further includes the p⁻-type region 1302 having a higher resistivity than the p-type region 601b between the p-type region 601b and the channel region 1003, unlike in the fourth embodiment. That is, in an orthogonal projection with respect to the substrate 403, a length 1320 from the channel region 1003 to the compound region 602 is longer than a length 1321 of the p-type region 601b. The p⁻-type region 1302 is formed from a semiconductor material having the same conductivity type as that of the p-type region 601b and has a lower impurity concentration than the p-type region 601b. The p-type region 601b and the p⁻-type region 1302 are formed from semiconductor materials having a conductivity type opposite to that of the channel region 1003. This makes it possible to relax an electric field at an end portion of the drain region of the light emission control transistor 204 and prevent an off-leakage current from the light emission control transistor 204 from flowing into the capacitive element 205. This can suppress variations in the signal voltage of a luminance signal held in the capacitive element 205.

A diffusion region 914 functioning as the drain region of the reset transistor 801 includes a p⁻-type region 1322, a p-type region 1113, and a compound region 1114. In the diffusion region 914, the p⁻-type region 1322, the p-type region 1113, and the compound region 1114 are arranged in this order from a side of a channel region 1004 along a direction in which a current flows. That is, in the diffusion region 914 functioning as the drain region of the reset transistor 801, the p-type region 1113 is arranged between the p⁻-type region 1322 and the compound region 1114. In other words, the diffusion region 914 further includes the p⁻-type region 1322 having a higher resistivity than the p-type region 1113 between the p-type region 1113 and the channel region 1004, unlike in the fourth embodiment. In an orthogonal projection with respect to the substrate 403, a length 1325 from the channel region 1004 to the compound region 1114 is longer than a length 1326 of the p-type region 1113. The p⁻-type region 1322 is formed from a semiconductor material having the same conductivity type as that of the p-type region 1113 and has a lower impurity concentration than the p-type region 1113. The p-type region 1113 and the p⁻-type region 1322 are formed from semiconductor materials having a conductivity type opposite to that of the channel region 1004. This makes it possible to relax an electric field at an end portion of the drain region of the reset transistor 801 and reduce a junction leakage current between the diffusion region 914 and a well 401 while the reset transistor 801 is off in an emission period.

In a portion, of the diffusion region 303, which functions as the source region of the reset transistor 801, a p⁻-type region 1308, the p-type region 501b, and the compound region 502 are arranged in this order from a side of the channel region 1004 along a direction in which a current flows. That is, in a portion, of the diffusion region 303, which functions as the source region of the reset transistor 801, the p-type region 501b is arranged between the p⁻-type region 1308 and the compound region 502. In other words, the diffusion region 303 further includes the p⁻-type region 1308 having a higher resistivity than the p-type region 501b between the p-type region 501b and the channel region 1004, unlike in the fourth embodiment. That is, in an orthogonal projection with respect to the substrate 403, a length 1327 from the channel region 1004 to the compound region 502 is longer than a length 1328 of the p-type region 501b. The p⁻-type region 1308 is formed from a semiconductor material having the same conductivity type as that of the p-type region 501b and has a lower impurity concentration than the p-type region 501b. The p-type region 501b and the type region 1308 are formed from semiconductor materials having a conductivity type opposite to that of the channel region 1004. This makes it possible to relax an electric field at an end portion of the source region of the reset transistor 801 and reduce a junction leakage current between the diffusion region 303 and the well 401 while the reset transistor 801 is off in an emission period. This can suppress a junction leakage current flowing into the light-emitting element 201.

The diffusion region 310 functioning as the source region of the write transistor 203 includes a p⁻-type region 1329, a p-type region 605, and a compound region 606. In the diffusion region 310, the p⁻-type region 1329, the p-type region 605, and the compound region 606 are arranged in this order from a side of a channel region 322 along a direction in which a current flows. That is, in the diffusion region 310 functioning as the source region of the write transistor 203, the p-type region 605 is arranged between the p⁻-type region 1329 and the compound region 606. In other words, the diffusion region 310 further includes the p⁻-type region 1329 having a higher resistivity than the p-type region 605 between the p-type region 605 and the channel region 322, unlike in the fourth embodiment. That is, in an orthogonal projection with respect to the substrate 403, a length 1332 from the channel region 322 to the compound region 606 is longer than a length 1333 of the p-type region 605. The p⁻-type region 1329 is formed from a semiconductor material having the same conductivity type as that of the p-type region 605 and has a lower impurity concentration than the p-type region 605. The p-type region 605 and the p⁻-type region 1329 are formed from semiconductor materials having a conductivity type opposite to that of the channel region 322. This reduces the parasitic capacitance between the gate electrode 309 and the signal line 108 connected to the diffusion region 310 and improves the driving performance of the write transistor 203. This makes it possible to increase the operation speed when sampling a luminance signal at the gate electrode 301 (capacitive element 205) of the drive transistor 202 at the time of switching the signal potential of the signal line 108 for each frame.

The diffusion region 311 functioning as the drain region of the write transistor 203 includes a p⁻-type region 1334, a p-type region 504, and a compound region 505. In the diffusion region 311, the p⁻-type region 1334, the p-type region 504, and the compound region 505 are arranged in this order from a side of the channel region 322 along a direction in which a current flows. That is, in the diffusion region 311 functioning as the drain region of a write transistor 203, the p-type region 504 is arranged between the p⁻-type region 1334 and the compound region 505. In other words, the diffusion region 311 further includes the p⁻-type region 1334 (sixth region) arranged between the p-type region 504 (fourth region) and the channel region 322 of the write transistor 203 and having a higher resistivity than the p-type region 504. That is, in an orthogonal projection with respect to the substrate 403, a length 1337 from the channel region 322 to the compound region 505 is longer than a length 1338 of the p-type region 504. The p⁻-type region 1334 is formed from a semiconductor material having the same conductivity type as that of the p-type region 504 and has a lower impurity concentration than the p-type region 504. The p-type region 504 and the p⁻-type region 1334 are formed from semiconductor materials having a conductivity type opposite to that of the channel region 322. This makes it possible to relax an electric field at an end portion of the drain region of the write transistor 203 and prevent an off-leakage current from the write transistor 203 from flowing into the capacitive element 205. This can suppress variations in the signal voltage of a luminance signal held in the capacitive element 205.

As shown in FIG. 14, the p⁻-type region 1301 and the p⁻-type region 1302 constituting parts of the diffusion region 302 may be connected to each other via a p⁻-type region 1401. In addition, the p-type region 601a and the p-type region 601b may be continuous. Likewise, the p⁻-type region 1308 and the p⁻-type region 1309 constituting parts of the diffusion region 303 may be connected to each other via a p⁻-type region 1403. In addition, the p-type region 501a and the p-type region 501b may be continuous. This can relax the electric field between the diffusion regions 302 and 303 and the well 401 and suppress a junction leakage current.

The p-type regions 501, 504, 601, 603, 605, and 1113 and the p⁻-type regions 1301, 1302, 1308, 1309, 1315, 1322, 1329, and 1334 may have different or same impurity concentrations and resistivities. Different or same metal materials may be used for the compound regions 502, 505, 602, 604, 606, and 1114. However, an increase in the number of processes can be suppressed by matching the impurity concentrations of the p-type regions 501, 504, 601, 603, 605, and 1113 and the p⁻-type regions 1301, 1302, 1308, 1309, 1315, 1322, 1329, and 1334 and metal materials used for the compound regions 502, 505, 602, 604, 606, and 1114.

The above arrangements enable this embodiment to obtain the same effects as those of each embodiment described above. As shown in FIGS. 13 and 14, all the transistors included in the pixel 702 may have diffusion regions obtained by combining offset structures and LDD structures. This can improve the image quality of the display apparatus 701.

The three embodiments of the present invention have been described above. Obviously, however, the present invention is not limited to these embodiments. The above embodiments can be changed and combined as appropriate without departing from the spirit of the present invention. For example, the write transistor 203 and the light emission control transistor 204 may be formed from n-type transistors. In this case, an element isolation portion can be arranged between the light emission control transistor 204 and the drive transistor 202. In addition, for example, in each pixel 102 of the display apparatus 101 exemplified in the first embodiment, the diffusion regions 303 and 311 may have the arrangements exemplified in the fifth embodiment. In each pixel 102 of the display apparatus 101 exemplified in the third embodiment, the diffusion regions 310 and 311 may have the arrangements exemplified in the fifth embodiment. Furthermore, the arrangements of the respective diffusion regions exemplified in the first to fifth embodiments may be combined in each of the pixels 102 and 702. In addition, for example, the diffusion layers of all the transistors included in each of the pixels 102 and 702 each may include a region having a low resistivity and a region having a high resistivity which is arranged closer to the channel region of each transistor than the region having the low resistivity. In this case, all the diffusion layers of all the transistors included in each of the pixels 102 and 702 each may include a region having a low resistivity and a region having a high resistivity which is arranged closer to the channel region of each transistor than the region having the low resistivity.

The display apparatuses 101 and 701 can be incorporated in various types of electronic devices. Such electronic devices can be, for example, cameras, computers, portable terminals, and onboard display apparatuses. An electronic device can include, for example, the display apparatus 101 or 701 and a control unit that controls the driving of the display apparatus 101 or 701.

Figure 15:
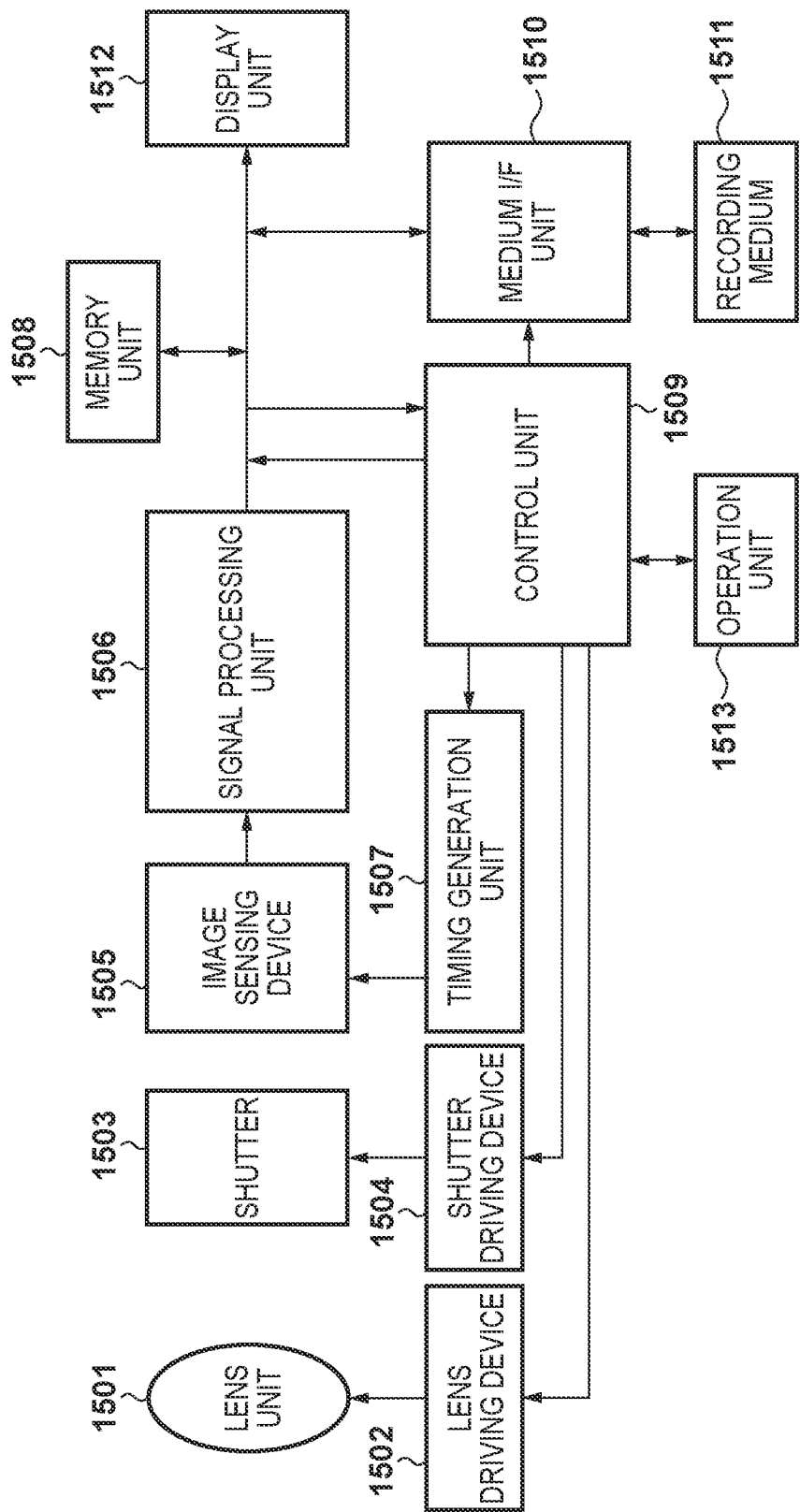
FIG. 15 is a block diagram showing an example of the arrangement of a camera using the display apparatus in FIG. 1.

An embodiment in which the display apparatus 101 or 701 described above is applied to the display unit of a digital camera will be described below with reference to FIG. 15. A lens unit 1501 is an imaging optical system that forms an optical image of an object on an image sensing device 1505, and includes a focus lens, a zoom lens, and a stop. A control unit 1509 controls, via a lens driving device 1502, driving concerning the focus lens position, the zoom lens position, the aperture diameter of the stop, and the like in the lens unit 1501.

A mechanical shutter 1503 is arranged between the lens unit 1501 and the image sensing device 1505. The control unit 1509 controls the driving of the mechanical shutter 1503 via a shutter driving device 1504. The image sensing device 1505 converts the optical image formed on the lens unit 1501 into an image signal with a plurality of pixels. A signal processing unit 1506 performs A/C conversion, demosaic processing, white balance adjustment processing, coding processing, and the like for the image signal output from the image sensing device 1505.

A timing generation unit 1507 outputs various types of timing signals to the image sensing device 1505 and the signal processing unit 1506. The control unit 1509 includes, for example, memories (a ROM and a RAM) and a microprocessor (CPU), and implements various types of functions of the digital camera by loading programs stored in the ROM into the RAM and causing the CPU to execute the programs to control the respective units. The functions implemented by the control unit 1509 include automatic focus detection (AF) and automatic exposure control (AE).

The control unit 1509 and the signal processing unit 1506 temporarily store image data in a memory unit 1508 and use it as a work area. A medium I/F 1510 is an interface for reading and writing data from and in a recording medium 1511, for example, a detachable memory card. A display unit 1512 displays captured images and various types of information concerning the digital camera. As the display unit 1512, the display apparatus 101 or 701 described above can be used. The control unit 1509 drives the display apparatus 101 or 701 mounted in the digital camera as the display unit 1512 to display images and various types of information. An operation unit 1513 is a user interface that includes a power switch, release button, and menu button and enables the user to issue instructions and make settings with respect to the digital camera.

An operation of the digital camera at the time of image capturing will be described next. When the user turns on the power supply, the camera is set in an imaging standby state. The control unit 1509 starts moving image capturing processing and display processing to make the display unit 1512 (display apparatus 101 or 701) operate as an electronic viewfinder. Upon receiving an imaging preparation instruction (for example, half-depressing the release button of the operation unit 1513) in the imaging standby state, the control unit 1509 starts focus detection processing.

The control unit 1509 obtains the moving amount and moving direction of the focus lens of the lens unit 1501 from the obtained defocus amount and direction, drives the focus lens via the lens driving device 1502, and adjusts the focus of the imaging optical system. After the driving, the control unit 1509 may finely adjust the focus lens position by further performing focus detection based on a contrast evaluation value, as needed.

Upon receiving an imaging start instruction (for example, fully depressing the release button), the control unit 1509 executes an imaging operation for recording, causes the signal processing unit 1506 to process obtained image data, and stores the data in the memory unit 1508. The control unit 1509 then records the image data stored in the memory unit 1508 on a recording medium 1511 via the medium I/F 1510. In addition, the control unit 1509 may drive the display unit 1512 (display apparatus 101 or 701) so as to display captured images. The control unit 1509 may output image data from an external I/F unit (not shown) to an external device such as a computer.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-204344, filed on Oct. 30, 2018, which is hereby incorporated by reference herein in its entirety.

What is claimed is:

1. A display apparatus including a plurality of pixels arranged in an array on a substrate,
   each of the plurality of pixels comprising a light-emitting element, a first transistor having a drain region connected to an anode of the light-emitting element, and a second transistor having a drain region connected to a gate electrode of the first transistor,
   wherein the drain region of the first transistor includes a first region and a second region arranged between the first region and a channel region of the first transistor and having a higher resistivity than the first region,
   the drain region of the second transistor which is connected to the gate electrode of the first transistor includes a third region and a fourth region arranged between the third region and a channel region of the second transistor and having a higher resistivity than the third region, and
   in an orthogonal projection with respect to the substrate, a length of the second region in a direction in which a current flows is longer than a length of the fourth region in a direction in which a current flows.

2. The apparatus according to claim 1, wherein the first region and the second region are formed from semiconductor materials having the same conductivity type,
   an impurity concentration of the second region is lower than an impurity concentration of the first region,
   the third region and the fourth region are formed from semiconductor materials having the same conductivity type, and
   an impurity concentration of the fourth region is lower than an impurity concentration of the third region.

3. The apparatus according to claim 1, wherein the first region and the third region each are formed from a compound of a semiconductor and a metal, and
   the second region and the fourth region are formed from semiconductor materials.

4. The apparatus according to claim 3, wherein the drain region of the first transistor further includes a fifth region arranged between the second region and the channel region of the first transistor and having a higher resistivity than the second region.

5. The apparatus according to claim 3, wherein the drain region of the second transistor further includes a sixth region arranged between the fourth region and the channel region of the second transistor and having a higher resistivity than the fourth region.

6. The apparatus according to claim 1, wherein a source region of the first transistor includes a seventh region and an eighth region arranged between the seventh region and the channel region of the first transistor and having a higher resistivity than the seventh region, and
   in an orthogonal projection with respect to the substrate, a length of the second region in a direction in which a current flows is longer than a length of the eighth region in a direction in which a current flows.

7. The apparatus according to claim 1, wherein each of the plurality of pixels further comprises a third transistor configured to short-circuit two terminals of the light-emitting element.

8. The apparatus according to claim 7, wherein a source region of the third transistor includes a ninth region and a 10th region arranged between the ninth region and the channel region of the third transistor and having a higher resistivity than the ninth region, and in an orthogonal projection with respect to the substrate, a length of the 10th region in a direction in which a current flows is longer than a length of the fourth region in a direction in which a current flows.

9. The apparatus according to claim 8, wherein a drain region of the third transistor includes an 11th region and a 12th region arranged between the 11th region and the channel region of the third transistor and having a higher resistivity than the 11th region, and in an orthogonal projection with respect to the substrate, a length of the 12th region in a direction in which a current flows is shorter than a length of the fourth region in a direction in which a current flows.

10. The apparatus according to claim 8, wherein each of the plurality of pixels further comprises a fourth transistor having a drain region connected to the source region of the first transistor and configured to control emission or non-emission of the light-emitting element, the fourth transistor operates in a linear region in an emission period in which the light-emitting element is caused to emit light, the drain region of the fourth transistor includes a 13th region and a 14th region arranged between the 13th region and a channel region of the fourth transistor and having a higher resistivity than the 13th region, and in an orthogonal projection with respect to the substrate, a length of the 10th region in a direction in which a current flows is longer than a length of the 14th region in a direction in which a current flows.

11. The apparatus according to claim 10, wherein in an orthogonal projection with respect to the substrate, a length of the second region in a direction in which a current flows is longer than a length of the 14th region in a direction in which a current flows.

12. The apparatus according to claim 1, wherein each of the plurality of pixels further comprises a fourth transistor having a drain region connected to a source region of the first transistor and configured to control emission or non-emission of the light-emitting element, and the fourth transistor operates in a linear region in an emission period in which the light-emitting element is caused to emit light.

13. The apparatus according to claim 9, wherein the drain region of the fourth transistor includes a 13th region and a 14th region arranged between the 13th region and a channel region of the fourth transistor and having a higher resistivity than the 13th region, and in an orthogonal projection with respect to the substrate, a length of the second region in a direction in which a current flows is longer than a length of the 14th region in a direction in which a current flows.

14. The apparatus according to claim 13, wherein the source region of the fourth transistor includes a 15th region and a 16th region arranged between the 15th region and the channel region of the fourth transistor and having a higher resistivity than the 15th region, and in an orthogonal projection with respect to the substrate, a length of the 16th region in a direction in which a current flows is shorter than a length of the fourth region in a direction in which a current flows.

15. The apparatus according to claim 1, wherein a source region of the second transistor includes a 17th region and an 18th region arranged between the 17th region and the channel region of the second transistor and having a higher resistivity than the 17th region, and in an orthogonal projection with respect to the substrate, a length of the 18th region in a direction in which a current flows is longer than a length of the fourth region in a direction in which a current flows.

16. An electronic device comprising:
a display apparatus according to claim 1; and
a control unit configured to control driving of the display apparatus.

17. A display apparatus including a plurality of pixels arranged in an array on a substrate, each of the plurality of pixels comprising a light-emitting element, a first transistor having a drain region connected to an anode of the light-emitting element, and a second transistor having a drain region connected to a gate electrode of the first transistor, wherein the drain region of the first transistor includes a first region and a second region arranged between the first region and a channel region of the first transistor, the drain region of the second transistor which is connected to the gate electrode of the first transistor includes a third region and a fourth region arranged between the third region and a channel region of the second transistor, the second region has the same conductivity type as the conductivity type of the first region and a lower impurity concentration than the first region, the fourth region has the same conductivity type as the conductivity type of the third region and a lower impurity concentration than the third region, and in an orthogonal projection with respect to the substrate, a length of the second region in a direction in which a current flows is longer than a length of the fourth region in a direction in which a current flows.

18. The apparatus according to claim 17, wherein the drain region of the first transistor further includes a first compound region formed from a compound of a semiconductor and a metal, the first region is arranged between the first compound region and the second region, the drain region of the second transistor further includes a second compound region formed from a compound of a semiconductor and a metal, and the third region is arranged between the second compound region and the fourth region.

19. A display apparatus including a plurality of pixels arranged in an array on a substrate, each of the plurality of pixels comprising a light-emitting element, a first transistor having a drain region connected to an anode of the light-emitting element, and a second transistor having a drain region connected to a gate electrode of the first transistor, wherein the drain region of the first transistor includes a first region and a second region arranged between the first region and a channel region of the first transistor, the drain region of the second transistor which is connected to the gate electrode of the first transistor includes a third region and a fourth region arranged between the third region and a channel region of the second transistor, the first region and the third region each are formed from a compound of a semiconductor and a metal, the second region and the fourth region are formed from semiconductor materials, and in an orthogonal projection with respect to the substrate, a length of the second region in a direction in which a current flows is longer than a length of the fourth region in a direction in which a current flows.

20. The apparatus according to claim 19, wherein the drain region of the first transistor further includes a fifth region arranged between the second region and the channel region of the first transistor, the fifth region has the same conductivity type as a conductivity type of the second region and has a lower impurity concentration than the second region, the drain region of the second transistor further includes a sixth region arranged between the fourth region and the channel region of the second transistor, and the sixth region has the same conductivity type as a conductivity type of the fourth region and has a lower impurity concentration than the fourth region.

* * * * *